United States Patent
Krames et al.

(10) Patent No.: US 8,905,588 B2
(45) Date of Patent: *Dec. 9, 2014

(54) SYSTEM AND METHOD FOR PROVIDING COLOR LIGHT SOURCES IN PROXIMITY TO PREDETERMINED WAVELENGTH CONVERSION STRUCTURES

(71) Applicant: Soraa, Inc., Fremont, CA (US)

(72) Inventors: Michael Krames, Mountain View, CA (US); Troy Trottier, San Jose, CA (US); Frank Steranka, San Jose, CA (US); William Houck, Fremont, CA (US); Arpan Chakraborty, Chandler, AZ (US)

(73) Assignee: Sorra, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/256,670

(22) Filed: Apr. 18, 2014

(65) Prior Publication Data

US 2014/0225137 A1    Aug. 14, 2014

Related U.S. Application Data

(63) Continuation of application No. 13/328,978, filed on Dec. 16, 2011, now Pat. No. 8,740,413, which is a (Continued)

(51) Int. Cl.
| | |
|---|---|
| F21V 9/00 | (2006.01) |
| F21V 9/16 | (2006.01) |
| F21S 4/00 | (2006.01) |
| F21V 21/00 | (2006.01) |
| H01J 1/62 | (2006.01) |
| H01J 63/04 | (2006.01) |
| H01L 33/00 | (2010.01) |
| H01L 27/15 | (2006.01) |
| H01L 33/50 | (2010.01) |

(52) U.S. Cl.
CPC ............ *H01L 33/504* (2013.01); *H01L 27/156* (2013.01)

USPC ........ 362/293; 362/84; 362/249.02; 362/231; 313/512; 313/502; 313/503; 257/98

(58) Field of Classification Search
USPC ............... 362/293, 84, 249.02, 231; 313/512, 313/502, 503; 257/98
See application file for complete search history.

(56) References Cited

U.S. PATENT DOCUMENTS

| | | | |
|---|---|---|---|
| 4,065,688 | A | 12/1977 | Thornton |
| 4,066,868 | A | 1/1978 | Witkin et al. |

(Continued)

FOREIGN PATENT DOCUMENTS

| | | |
|---|---|---|
| CN | 101009347 | 3/1987 |
| CN | 1538534 | 10/2004 |

(Continued)

OTHER PUBLICATIONS

Abare, 'Cleaved and Etched Facet Nitride Laser Diodes', IEEE Journal of Selected Topics in Quantum Electronics, vol. 4, No. 3, 1998, p. 505-509.

(Continued)

*Primary Examiner* — Ismael Negron
*Assistant Examiner* — William N Harris
(74) *Attorney, Agent, or Firm* — Kilpatrick Townsend & Stockton LLP

(57) ABSTRACT

An optical device includes a light source with at least two radiation sources, and at least two layers of wavelength-modifying materials excited by the radiation sources that emit radiation in at least two predetermined wavelengths. Embodiments include a first plurality of n radiation sources configured to emit radiation at a first wavelength. The first plurality of radiation sources are in proximity to a second plurality of m of radiation sources configured to emit radiation at a second wavelength, the second wavelength being shorter than the first wavelength. The ratio between m and n is predetermined. The disclosed optical device also comprises at least two wavelength converting layers such that a first wavelength converting layer is configured to absorb a portion of radiation emitted by the second radiation sources, and a second wavelength converting layer configured to absorb a portion of radiation emitted by the second radiation sources.

20 Claims, 19 Drawing Sheets

Related U.S. Application Data continuation-in-part of application No. 13/019,897, filed on Feb. 2, 2011, which is a continuation-in-part of application No. 13/014,622, filed on Jan. 26, 2011.

(60) Provisional application No. 61/424,562, filed on Dec. 17, 2010, provisional application No. 61/301,193, filed on Feb. 3, 2010, provisional application No. 61/357,849, filed on Jun. 23, 2010.

(56) References Cited

U.S. PATENT DOCUMENTS

| | | |
|---|---|---|
| 4,318,058 A | 3/1982 | Mito et al. |
| 4,341,592 A | 7/1982 | Shortes et al. |
| 4,350,560 A | 9/1982 | Helgeland et al. |
| 4,581,646 A | 4/1986 | Kubodera |
| 4,860,687 A | 8/1989 | Frijlink |
| 4,870,045 A | 9/1989 | Gasper et al. |
| 4,911,102 A | 3/1990 | Manabe et al. |
| 5,169,486 A | 12/1992 | Young et al. |
| 5,331,654 A | 7/1994 | Jewell et al. |
| 5,334,277 A | 8/1994 | Nakamura |
| 5,527,417 A | 6/1996 | Iida et al. |
| 5,607,899 A | 3/1997 | Yoshida et al. |
| 5,632,812 A | 5/1997 | Hirabayashi |
| 5,637,531 A | 6/1997 | Porowski et al. |
| 5,647,945 A | 7/1997 | Matsuse et al. |
| 5,679,152 A | 10/1997 | Tischler et al. |
| 5,764,674 A | 6/1998 | Hibbs-Brenner et al. |
| 5,813,753 A | 9/1998 | Vriens et al. |
| 5,821,555 A | 10/1998 | Saito et al. |
| 5,888,907 A | 3/1999 | Tomoyasu et al. |
| 5,951,923 A | 9/1999 | Horie et al. |
| 6,069,394 A | 5/2000 | Hashimoto et al. |
| 6,072,197 A | 6/2000 | Horino et al. |
| 6,150,774 A | 11/2000 | Mueller et al. |
| 6,153,010 A | 11/2000 | Kiyoku et al. |
| 6,195,381 B1 | 2/2001 | Botez et al. |
| 6,335,771 B1 | 1/2002 | Hiraishi |
| 6,379,985 B1 | 4/2002 | Cervantes et al. |
| 6,413,627 B1 | 7/2002 | Motoki et al. |
| 6,440,823 B1 | 8/2002 | Vaudo et al. |
| 6,451,157 B1 | 9/2002 | Hubacek |
| 6,468,347 B1 | 10/2002 | Motoki et al. |
| 6,468,882 B2 | 10/2002 | Motoki et al. |
| 6,488,767 B1 | 12/2002 | Xu et al. |
| 6,498,355 B1 | 12/2002 | Harrah et al. |
| 6,498,440 B2 | 12/2002 | Stam et al. |
| 6,501,154 B2 | 12/2002 | Morita et al. |
| 6,509,651 B1 | 1/2003 | Matsubara et al. |
| 6,533,874 B1 | 3/2003 | Vaudo et al. |
| 6,547,249 B2 | 4/2003 | Collins, III et al. |
| 6,559,075 B1 | 5/2003 | Kelly et al. |
| 6,621,211 B1 | 9/2003 | Srivastava et al. |
| 6,635,904 B2 | 10/2003 | Goetz et al. |
| 6,639,925 B2 | 10/2003 | Niwa et al. |
| 6,680,959 B2 | 1/2004 | Tanabe et al. |
| 6,734,461 B1 | 5/2004 | Shiomi et al. |
| 6,755,932 B2 | 6/2004 | Masuda et al. |
| 6,809,781 B2 | 10/2004 | Setlur et al. |
| 6,814,811 B2 | 11/2004 | Ose |
| 6,833,564 B2 | 12/2004 | Shen et al. |
| 6,853,010 B2 | 2/2005 | Slater, Jr. et al. |
| 6,858,081 B2 | 2/2005 | Biwa et al. |
| 6,858,882 B2 | 2/2005 | Tsuda et al. |
| 6,864,641 B2 | 3/2005 | Dygert |
| 6,920,166 B2 | 7/2005 | Akasaka et al. |
| 6,956,246 B1 | 10/2005 | Epler et al. |
| 6,989,807 B2 | 1/2006 | Chiang |
| 7,005,679 B2 | 2/2006 | Tarsa et al. |
| 7,009,199 B2 | 3/2006 | Hall |
| 7,012,279 B2 | 3/2006 | Wierer, Jr. et al. |
| 7,019,325 B2 | 3/2006 | Li et al. |
| 7,027,015 B2 | 4/2006 | Booth, Jr. et al. |
| 7,033,858 B2 | 4/2006 | Chai et al. |
| 7,038,399 B2 | 5/2006 | Lys et al. |
| 7,053,413 B2 | 5/2006 | D'Evelyn et al. |
| 7,067,985 B2 | 6/2006 | Adachi |
| 7,067,995 B2 | 6/2006 | Gunter et al. |
| 7,081,722 B1 | 7/2006 | Huynh et al. |
| 7,083,302 B2 | 8/2006 | Chen et al. |
| 7,095,056 B2 | 8/2006 | Vitta et al. |
| 7,113,658 B2 | 9/2006 | Ide et al. |
| 7,128,849 B2 | 10/2006 | Setlur et al. |
| 7,148,515 B1 | 12/2006 | Huang et al. |
| 7,173,384 B2 | 2/2007 | Plotz et al. |
| 7,213,940 B1 | 5/2007 | Van De Ven et al. |
| 7,220,324 B2 | 5/2007 | Baker et al. |
| 7,233,831 B2 | 6/2007 | Blackwell |
| 7,252,408 B2 | 8/2007 | Mazzochette et al. |
| 7,253,446 B2 | 8/2007 | Sakuma et al. |
| 7,279,040 B1 | 10/2007 | Wang |
| 7,285,799 B2 | 10/2007 | Kim et al. |
| 7,285,801 B2 | 10/2007 | Eliashevich et al. |
| 7,303,630 B2 | 12/2007 | Motoki et al. |
| 7,312,156 B2 | 12/2007 | Granneman et al. |
| 7,318,651 B2 | 1/2008 | Chua et al. |
| 7,338,828 B2 | 3/2008 | Imer et al. |
| 7,341,880 B2 | 3/2008 | Erchak et al. |
| 7,352,138 B2 | 4/2008 | Lys et al. |
| 7,358,542 B2 | 4/2008 | Radkov et al. |
| 7,358,543 B2 | 4/2008 | Chua et al. |
| 7,358,679 B2 | 4/2008 | Lys et al. |
| 7,390,359 B2 | 6/2008 | Miyanaga et al. |
| 7,419,281 B2 | 9/2008 | Porchia et al. |
| 7,470,938 B2 | 12/2008 | Lee et al. |
| 7,483,466 B2 | 1/2009 | Uchida et al. |
| 7,483,468 B2 | 1/2009 | Tanaka |
| 7,489,441 B2 | 2/2009 | Scheible et al. |
| 7,491,984 B2 | 2/2009 | Koike et al. |
| 7,550,305 B2 | 6/2009 | Yamagata et al. |
| 7,555,025 B2 | 6/2009 | Yoshida |
| 7,560,981 B2 | 7/2009 | Chao et al. |
| 7,564,180 B2 | 7/2009 | Brandes |
| 7,598,104 B2 | 10/2009 | Teng et al. |
| 7,622,742 B2 | 11/2009 | Kim et al. |
| 7,691,658 B2 | 4/2010 | Kaeding et al. |
| 7,709,284 B2 | 5/2010 | Iza et al. |
| 7,727,332 B2 | 6/2010 | Habel et al. |
| 7,733,571 B1 | 6/2010 | Li |
| 7,737,457 B2 | 6/2010 | Kolodin et al. |
| 7,749,326 B2 | 7/2010 | Kim et al. |
| 7,791,093 B2 | 9/2010 | Basin et al. |
| 7,806,078 B2 | 10/2010 | Yoshida |
| 7,816,238 B2 | 10/2010 | Osada et al. |
| 7,858,408 B2 | 12/2010 | Mueller et al. |
| 7,862,761 B2 | 1/2011 | Okushima et al. |
| 7,871,839 B2 | 1/2011 | Lee et al. |
| 7,884,538 B2 * | 2/2011 | Mitsuishi et al. ............ 313/502 |
| 7,906,793 B2 | 3/2011 | Negley |
| 7,923,741 B1 | 4/2011 | Zhai et al. |
| 7,939,354 B2 | 5/2011 | Kyono et al. |
| 7,968,864 B2 | 6/2011 | Akita et al. |
| 8,044,412 B2 | 10/2011 | Murphy et al. |
| 8,044,609 B2 | 10/2011 | Liu |
| 8,124,996 B2 | 2/2012 | Raring et al. |
| 8,126,024 B1 | 2/2012 | Raring |
| 8,142,566 B2 | 3/2012 | Kiyomi et al. |
| 8,143,148 B1 | 3/2012 | Raring et al. |
| 8,188,504 B2 | 5/2012 | Lee |
| 8,198,643 B2 | 6/2012 | Lee et al. |
| 8,203,161 B2 | 6/2012 | Simonian et al. |
| 8,207,548 B2 | 6/2012 | Nagai |
| 8,207,554 B2 | 6/2012 | Shum |
| 8,242,522 B1 | 8/2012 | Raring |
| 8,247,886 B1 | 8/2012 | Sharma et al. |
| 8,247,887 B1 | 8/2012 | Raring et al. |
| 8,252,662 B1 | 8/2012 | Poblenz et al. |
| 8,254,425 B1 | 8/2012 | Raring |
| 8,259,769 B1 | 9/2012 | Raring et al. |
| 8,269,245 B1 | 9/2012 | Shum |
| 8,284,810 B1 | 10/2012 | Sharma et al. |
| 8,293,551 B2 | 10/2012 | Sharma et al. |
| 8,294,179 B1 | 10/2012 | Raring |

(56) References Cited

U.S. PATENT DOCUMENTS

| | | |
|---|---|---|
| 8,299,473 B1 | 10/2012 | D'Evelyn et al. |
| 8,310,143 B2 | 11/2012 | Van De Ven et al. |
| 8,314,429 B1 | 11/2012 | Raring et al. |
| 8,324,840 B2 | 12/2012 | Shteynberg et al. |
| 8,350,273 B2 | 1/2013 | Vielemeyer |
| 8,351,478 B2 | 1/2013 | Raring et al. |
| 8,355,418 B2 | 1/2013 | Raring et al. |
| 8,362,603 B2 | 1/2013 | Lim et al. |
| 8,404,071 B2 | 3/2013 | Cope et al. |
| 8,410,711 B2 | 4/2013 | Lin et al. |
| 8,410,717 B2 | 4/2013 | Shteynberg et al. |
| 8,416,825 B1 | 4/2013 | Raring |
| 8,422,525 B1 | 4/2013 | Raring et al. |
| 8,427,590 B2 | 4/2013 | Raring et al. |
| 8,451,876 B1 | 5/2013 | Raring et al. |
| 8,455,894 B1 | 6/2013 | D'Evelyn et al. |
| 8,502,465 B2 | 8/2013 | Katona et al. |
| 8,519,437 B2 | 8/2013 | Chakraborty |
| 8,524,578 B1 | 9/2013 | Raring et al. |
| 8,541,951 B1 | 9/2013 | Shum et al. |
| 8,575,642 B1 | 11/2013 | Shum |
| 8,575,728 B1 | 11/2013 | Raring et al. |
| 8,740,413 B1 | 6/2014 | Krames et al. |
| 2001/0009134 A1 | 7/2001 | Kim et al. |
| 2001/0022495 A1 | 9/2001 | Salam |
| 2001/0043042 A1 | 11/2001 | Murazaki et al. |
| 2001/0048114 A1 | 12/2001 | Morita et al. |
| 2001/0055208 A1 | 12/2001 | Kimura |
| 2002/0027933 A1 | 3/2002 | Tanabe et al. |
| 2002/0070416 A1 | 6/2002 | Morse et al. |
| 2002/0085603 A1 | 7/2002 | Okumura |
| 2002/0088985 A1 | 7/2002 | Komoto et al. |
| 2002/0096994 A1 | 7/2002 | Iwafuchi et al. |
| 2002/0105986 A1 | 8/2002 | Yamasaki |
| 2002/0155691 A1 | 10/2002 | Lee et al. |
| 2002/0171092 A1 | 11/2002 | Goetz et al. |
| 2002/0182768 A1 | 12/2002 | Morse et al. |
| 2003/0000453 A1 | 1/2003 | Unno et al. |
| 2003/0001238 A1 | 1/2003 | Ban |
| 2003/0012243 A1 | 1/2003 | Okumura |
| 2003/0020087 A1 | 1/2003 | Goto et al. |
| 2003/0030063 A1 | 2/2003 | Sosniak et al. |
| 2003/0047076 A1 | 3/2003 | Liu |
| 2003/0080345 A1 | 5/2003 | Motoki et al. |
| 2003/0129810 A1 | 7/2003 | Barth et al. |
| 2003/0140846 A1 | 7/2003 | Biwa et al. |
| 2003/0145783 A1 | 8/2003 | Motoki et al. |
| 2003/0164507 A1 | 9/2003 | Edmond et al. |
| 2003/0178617 A1 | 9/2003 | Appenzeller et al. |
| 2003/0200931 A1 | 10/2003 | Goodwin |
| 2003/0216011 A1 | 11/2003 | Nakamura et al. |
| 2004/0025787 A1 | 2/2004 | Selbrede et al. |
| 2004/0036079 A1 | 2/2004 | Nakada et al. |
| 2004/0060518 A1 | 4/2004 | Nakamura et al. |
| 2004/0066140 A1 | 4/2004 | Omoto |
| 2004/0070004 A1 | 4/2004 | Eliashevich et al. |
| 2004/0080256 A1 | 4/2004 | Hampden-Smith et al. |
| 2004/0099213 A1 | 5/2004 | Adomaitis et al. |
| 2004/0104391 A1 | 6/2004 | Maeda et al. |
| 2004/0116033 A1 | 6/2004 | Ouderkirk et al. |
| 2004/0124435 A1 | 7/2004 | D'Evelyn et al. |
| 2004/0146264 A1 | 7/2004 | Auner et al. |
| 2004/0151222 A1 | 8/2004 | Sekine |
| 2004/0161222 A1 | 8/2004 | Niida et al. |
| 2004/0190304 A1 | 9/2004 | Sugimoto et al. |
| 2004/0195598 A1 | 10/2004 | Tysoe et al. |
| 2004/0201598 A1 | 10/2004 | Eliav et al. |
| 2004/0207998 A1 | 10/2004 | Suehiro et al. |
| 2004/0227149 A1 | 11/2004 | Ibbetson et al. |
| 2004/0233950 A1 | 11/2004 | Furukawa et al. |
| 2004/0247275 A1 | 12/2004 | Vakhshoori et al. |
| 2004/0251471 A1 | 12/2004 | Dwilinski et al. |
| 2005/0040384 A1 | 2/2005 | Tanaka et al. |
| 2005/0072986 A1 | 4/2005 | Sasaoka |
| 2005/0084218 A1 | 4/2005 | Ide et al. |
| 2005/0087753 A1 | 4/2005 | D'Evelyn et al. |
| 2005/0109240 A1 | 5/2005 | Maeta et al. |
| 2005/0121679 A1 | 6/2005 | Nagahama et al. |
| 2005/0167680 A1 | 8/2005 | Shei et al. |
| 2005/0168564 A1 | 8/2005 | Kawaguchi et al. |
| 2005/0199899 A1 | 9/2005 | Lin et al. |
| 2005/0214992 A1 | 9/2005 | Chakraborty et al. |
| 2005/0218413 A1 | 10/2005 | Matsumoto et al. |
| 2005/0218780 A1 | 10/2005 | Chen |
| 2005/0224830 A1 | 10/2005 | Blonder et al. |
| 2005/0229855 A1 | 10/2005 | Raaijmakers |
| 2005/0230701 A1 | 10/2005 | Huang |
| 2005/0247260 A1 | 11/2005 | Shin et al. |
| 2005/0263791 A1 | 12/2005 | Yanagihara et al. |
| 2005/0285128 A1 | 12/2005 | Scherer et al. |
| 2005/0286591 A1 | 12/2005 | Lee |
| 2006/0006404 A1 | 1/2006 | Ibbetson et al. |
| 2006/0033009 A1 | 2/2006 | Kobayashi et al. |
| 2006/0038542 A1 | 2/2006 | Park et al. |
| 2006/0060131 A1 | 3/2006 | Atanackovic |
| 2006/0060872 A1 | 3/2006 | Edmond et al. |
| 2006/0065900 A1 | 3/2006 | Hsieh et al. |
| 2006/0068154 A1 | 3/2006 | Parce et al. |
| 2006/0077795 A1 | 4/2006 | Kitahara et al. |
| 2006/0078022 A1 | 4/2006 | Kozaki et al. |
| 2006/0079082 A1 | 4/2006 | Bruhns et al. |
| 2006/0086319 A1 | 4/2006 | Kasai et al. |
| 2006/0097385 A1 | 5/2006 | Negley |
| 2006/0118799 A1 | 6/2006 | D'Evelyn et al. |
| 2006/0124051 A1 | 6/2006 | Yoshioka et al. |
| 2006/0126688 A1 | 6/2006 | Kneissl |
| 2006/0138435 A1 | 6/2006 | Tarsa et al. |
| 2006/0144334 A1 | 7/2006 | Yim et al. |
| 2006/0149607 A1 | 7/2006 | Sayers et al. |
| 2006/0152795 A1 | 7/2006 | Yang |
| 2006/0163589 A1 | 7/2006 | Fan et al. |
| 2006/0166390 A1 | 7/2006 | Letertre et al. |
| 2006/0169993 A1 | 8/2006 | Fan et al. |
| 2006/0175624 A1 | 8/2006 | Sharma et al. |
| 2006/0177362 A1 | 8/2006 | D'Evelyn et al. |
| 2006/0189098 A1 | 8/2006 | Edmond |
| 2006/0193359 A1 | 8/2006 | Kuramoto |
| 2006/0205199 A1 | 9/2006 | Baker et al. |
| 2006/0208262 A1 | 9/2006 | Sakuma et al. |
| 2006/0213429 A1 | 9/2006 | Motoki et al. |
| 2006/0214287 A1 | 9/2006 | Ogihara et al. |
| 2006/0216416 A1 | 9/2006 | Sumakeris et al. |
| 2006/0240585 A1 | 10/2006 | Epler et al. |
| 2006/0255343 A1 | 11/2006 | Ogihara et al. |
| 2006/0256482 A1 | 11/2006 | Araki et al. |
| 2006/0261364 A1 | 11/2006 | Suehiro et al. |
| 2006/0262545 A1 | 11/2006 | Piepgras et al. |
| 2006/0273339 A1 | 12/2006 | Steigerwald et al. |
| 2006/0288927 A1 | 12/2006 | Chodelka et al. |
| 2007/0007898 A1 | 1/2007 | Bruning |
| 2007/0018184 A1 | 1/2007 | Beeson et al. |
| 2007/0045200 A1 | 3/2007 | Moon et al. |
| 2007/0081857 A1 | 4/2007 | Yoon |
| 2007/0086916 A1 | 4/2007 | LeBoeuf et al. |
| 2007/0093073 A1 | 4/2007 | Farrell, Jr. et al. |
| 2007/0096239 A1 | 5/2007 | Cao et al. |
| 2007/0101932 A1 | 5/2007 | Schowalter et al. |
| 2007/0105351 A1 | 5/2007 | Motoki et al. |
| 2007/0110112 A1 | 5/2007 | Sugiura |
| 2007/0114563 A1 | 5/2007 | Paek et al. |
| 2007/0114569 A1 | 5/2007 | Wu et al. |
| 2007/0120141 A1 | 5/2007 | Moustakas et al. |
| 2007/0121690 A1 | 5/2007 | Fujii et al. |
| 2007/0126023 A1 | 6/2007 | Haskell et al. |
| 2007/0131967 A1 | 6/2007 | Kawaguchi et al. |
| 2007/0139920 A1 | 6/2007 | Van De Ven et al. |
| 2007/0153866 A1 | 7/2007 | Shchegrov et al. |
| 2007/0163490 A1 | 7/2007 | Habel et al. |
| 2007/0170450 A1 | 7/2007 | Murphy |
| 2007/0181895 A1 | 8/2007 | Nagai |
| 2007/0184637 A1 | 8/2007 | Haskell et al. |
| 2007/0202624 A1 | 8/2007 | Yoon et al. |
| 2007/0210074 A1 | 9/2007 | Maurer et al. |
| 2007/0217462 A1 | 9/2007 | Yamasaki |

(56) References Cited

U.S. PATENT DOCUMENTS

| | | |
|---|---|---|
| 2007/0228404 A1 | 10/2007 | Tran et al. |
| 2007/0231963 A1 | 10/2007 | Doan et al. |
| 2007/0231978 A1 | 10/2007 | Kanamoto et al. |
| 2007/0240346 A1 | 10/2007 | Li et al. |
| 2007/0242716 A1 | 10/2007 | Samal et al. |
| 2007/0259206 A1 | 11/2007 | Oshio |
| 2007/0259464 A1 | 11/2007 | Bour et al. |
| 2007/0264733 A1 | 11/2007 | Choi et al. |
| 2007/0272933 A1 | 11/2007 | Kim et al. |
| 2007/0280320 A1 | 12/2007 | Feezell et al. |
| 2007/0290224 A1 | 12/2007 | Ogawa |
| 2008/0006837 A1 | 1/2008 | Park et al. |
| 2008/0023691 A1 | 1/2008 | Jang et al. |
| 2008/0029152 A1 | 2/2008 | Milshtein et al. |
| 2008/0030976 A1 | 2/2008 | Murazaki et al. |
| 2008/0054290 A1 | 3/2008 | Shieh et al. |
| 2008/0073660 A1 | 3/2008 | Ohno et al. |
| 2008/0083741 A1 | 4/2008 | Giddings et al. |
| 2008/0083929 A1 | 4/2008 | Fan et al. |
| 2008/0087919 A1 | 4/2008 | Tysoe et al. |
| 2008/0092812 A1 | 4/2008 | McDiarmid et al. |
| 2008/0095492 A1 | 4/2008 | Son et al. |
| 2008/0099777 A1 | 5/2008 | Erchak et al. |
| 2008/0106212 A1 | 5/2008 | Yen et al. |
| 2008/0121906 A1 | 5/2008 | Yakushiji |
| 2008/0121916 A1 | 5/2008 | Teng et al. |
| 2008/0124817 A1 | 5/2008 | Bour et al. |
| 2008/0128752 A1 | 6/2008 | Wu |
| 2008/0142781 A1 | 6/2008 | Lee |
| 2008/0149949 A1 | 6/2008 | Nakamura et al. |
| 2008/0149959 A1 | 6/2008 | Nakamura et al. |
| 2008/0164489 A1 | 7/2008 | Schmidt et al. |
| 2008/0164578 A1 | 7/2008 | Tanikella et al. |
| 2008/0173735 A1 | 7/2008 | Mitrovic et al. |
| 2008/0173884 A1 | 7/2008 | Chitnis et al. |
| 2008/0179607 A1 | 7/2008 | DenBaars et al. |
| 2008/0179610 A1 | 7/2008 | Okamoto et al. |
| 2008/0191223 A1 | 8/2008 | Nakamura et al. |
| 2008/0192791 A1 | 8/2008 | Furukawa et al. |
| 2008/0194054 A1 | 8/2008 | Lin et al. |
| 2008/0198881 A1 | 8/2008 | Farrell et al. |
| 2008/0206925 A1 | 8/2008 | Chatterjee et al. |
| 2008/0210958 A1 | 9/2008 | Senda et al. |
| 2008/0211416 A1 | 9/2008 | Negley et al. |
| 2008/0217745 A1 | 9/2008 | Miyanaga et al. |
| 2008/0230765 A1 | 9/2008 | Yoon et al. |
| 2008/0232416 A1 | 9/2008 | Okamoto et al. |
| 2008/0237569 A1 | 10/2008 | Nago et al. |
| 2008/0251020 A1 | 10/2008 | Franken et al. |
| 2008/0261341 A1 | 10/2008 | Zimmerman et al. |
| 2008/0261381 A1 | 10/2008 | Akiyama et al. |
| 2008/0272463 A1 | 11/2008 | Butcher et al. |
| 2008/0274574 A1 | 11/2008 | Yun |
| 2008/0282978 A1 | 11/2008 | Butcher et al. |
| 2008/0283851 A1 | 11/2008 | Akita |
| 2008/0284346 A1 | 11/2008 | Lee |
| 2008/0285609 A1 | 11/2008 | Ohta et al. |
| 2008/0291961 A1 | 11/2008 | Kamikawa et al. |
| 2008/0298409 A1 | 12/2008 | Yamashita et al. |
| 2008/0303033 A1 | 12/2008 | Brandes |
| 2008/0308815 A1 | 12/2008 | Kasai et al. |
| 2008/0315179 A1 | 12/2008 | Kim et al. |
| 2009/0021723 A1 | 1/2009 | De Lega |
| 2009/0028204 A1 | 1/2009 | Hiroyama et al. |
| 2009/0050908 A1 | 2/2009 | Yuan et al. |
| 2009/0058532 A1 | 3/2009 | Kikkawa et al. |
| 2009/0065798 A1 | 3/2009 | Masui et al. |
| 2009/0066241 A1 | 3/2009 | Yokoyama |
| 2009/0072252 A1 | 3/2009 | Son et al. |
| 2009/0078944 A1 | 3/2009 | Kubota et al. |
| 2009/0078955 A1 | 3/2009 | Fan et al. |
| 2009/0080857 A1 | 3/2009 | St. John-Larkin |
| 2009/0081857 A1 | 3/2009 | Hanser et al. |
| 2009/0086475 A1 | 4/2009 | Caruso et al. |
| 2009/0140279 A1 | 6/2009 | Zimmerman et al. |
| 2009/0141765 A1 | 6/2009 | Kohda et al. |
| 2009/0146170 A1 | 6/2009 | Zhong et al. |
| 2009/0153752 A1 | 6/2009 | Silverstein |
| 2009/0159869 A1 | 6/2009 | Ponce et al. |
| 2009/0173958 A1 | 7/2009 | Chakraborty et al. |
| 2009/0194796 A1 | 8/2009 | Hashimoto et al. |
| 2009/0206354 A1 | 8/2009 | Kitano et al. |
| 2009/0213120 A1 | 8/2009 | Nisper et al. |
| 2009/0227056 A1 | 9/2009 | Kyono et al. |
| 2009/0229519 A1 | 9/2009 | Saitoh |
| 2009/0250686 A1 | 10/2009 | Sato et al. |
| 2009/0252191 A1 | 10/2009 | Kubota et al. |
| 2009/0267098 A1 | 10/2009 | Choi |
| 2009/0267100 A1 | 10/2009 | Miyake et al. |
| 2009/0273005 A1 | 11/2009 | Lin |
| 2009/0302338 A1 | 12/2009 | Nagai et al. |
| 2009/0309110 A1 | 12/2009 | Raring et al. |
| 2009/0309127 A1 | 12/2009 | Raring et al. |
| 2009/0310640 A1 | 12/2009 | Sato et al. |
| 2009/0315480 A1 | 12/2009 | Yan et al. |
| 2009/0315965 A1 | 12/2009 | Yamagata et al. |
| 2009/0316116 A1 | 12/2009 | Melville et al. |
| 2009/0321745 A1 | 12/2009 | Kinoshita et al. |
| 2009/0321778 A1 | 12/2009 | Chen et al. |
| 2010/0001300 A1 | 1/2010 | Raring et al. |
| 2010/0003492 A1 | 1/2010 | D'Evelyn |
| 2010/0006546 A1 | 1/2010 | Young et al. |
| 2010/0006873 A1 | 1/2010 | Raring et al. |
| 2010/0025656 A1 | 2/2010 | Raring et al. |
| 2010/0032691 A1 | 2/2010 | Kim |
| 2010/0044718 A1 | 2/2010 | Hanser et al. |
| 2010/0055819 A1 | 3/2010 | Ohba et al. |
| 2010/0060130 A1 | 3/2010 | Li |
| 2010/0096615 A1 | 4/2010 | Okamoto et al. |
| 2010/0104495 A1 | 4/2010 | Kawabata et al. |
| 2010/0108985 A1 | 5/2010 | Chung et al. |
| 2010/0109030 A1 | 5/2010 | Krames et al. |
| 2010/0117101 A1 | 5/2010 | Kim et al. |
| 2010/0117106 A1* | 5/2010 | Trottier ........................... 257/98 |
| 2010/0117118 A1 | 5/2010 | Dabiran et al. |
| 2010/0140630 A1 | 6/2010 | Hamaguchi et al. |
| 2010/0140745 A1 | 6/2010 | Khan et al. |
| 2010/0148145 A1 | 6/2010 | Ishibashi et al. |
| 2010/0148210 A1 | 6/2010 | Huang et al. |
| 2010/0149814 A1 | 6/2010 | Zhai et al. |
| 2010/0155746 A1 | 6/2010 | Ibbetson et al. |
| 2010/0164403 A1 | 7/2010 | Liu |
| 2010/0195687 A1 | 8/2010 | Okamoto et al. |
| 2010/0200837 A1 | 8/2010 | Zimmerman et al. |
| 2010/0220262 A1 | 9/2010 | DeMille et al. |
| 2010/0240158 A1 | 9/2010 | Ter-Hovhannissian |
| 2010/0258830 A1 | 10/2010 | Ide et al. |
| 2010/0276663 A1 | 11/2010 | Enya et al. |
| 2010/0290208 A1* | 11/2010 | Pickard ........................... 362/84 |
| 2010/0295054 A1 | 11/2010 | Okamoto et al. |
| 2010/0295088 A1 | 11/2010 | D'Evelyn et al. |
| 2010/0302464 A1 | 12/2010 | Raring et al. |
| 2010/0309943 A1 | 12/2010 | Chakraborty et al. |
| 2010/0316075 A1 | 12/2010 | Raring et al. |
| 2010/0327291 A1 | 12/2010 | Preble et al. |
| 2011/0017298 A1 | 1/2011 | Lee |
| 2011/0031508 A1 | 2/2011 | Hamaguchi et al. |
| 2011/0038154 A1 | 2/2011 | Chakravarty et al. |
| 2011/0056429 A1 | 3/2011 | Raring et al. |
| 2011/0057167 A1 | 3/2011 | Ueno et al. |
| 2011/0064100 A1 | 3/2011 | Raring et al. |
| 2011/0064101 A1 | 3/2011 | Raring et al. |
| 2011/0064102 A1 | 3/2011 | Raring et al. |
| 2011/0068700 A1 | 3/2011 | Fan |
| 2011/0069490 A1 | 3/2011 | Liu |
| 2011/0073888 A1 | 3/2011 | Ueno et al. |
| 2011/0075694 A1 | 3/2011 | Yoshizumi et al. |
| 2011/0101400 A1 | 5/2011 | Chu et al. |
| 2011/0101414 A1 | 5/2011 | Thompson et al. |
| 2011/0103064 A1 | 5/2011 | Coe-Sullivan et al. |
| 2011/0103418 A1 | 5/2011 | Hardy et al. |
| 2011/0108081 A1 | 5/2011 | Werthen et al. |
| 2011/0108865 A1 | 5/2011 | Aldaz et al. |
| 2011/0121331 A1 | 5/2011 | Simonian et al. |

(56) References Cited

U.S. PATENT DOCUMENTS

| | | |
|---|---|---|
| 2011/0124139 A1 | 5/2011 | Chang |
| 2011/0129669 A1 | 6/2011 | Fujito et al. |
| 2011/0140150 A1 | 6/2011 | Shum |
| 2011/0150020 A1 | 6/2011 | Haase et al. |
| 2011/0164637 A1 | 7/2011 | Yoshizumi et al. |
| 2011/0175200 A1 | 7/2011 | Yoshida |
| 2011/0180781 A1 | 7/2011 | Raring et al. |
| 2011/0182056 A1 | 7/2011 | Trottier et al. |
| 2011/0182065 A1 | 7/2011 | Negley et al. |
| 2011/0186860 A1 | 8/2011 | Enya et al. |
| 2011/0186874 A1 | 8/2011 | Shum |
| 2011/0186887 A1 | 8/2011 | Trottier et al. |
| 2011/0188530 A1 | 8/2011 | Lell et al. |
| 2011/0198979 A1 | 8/2011 | Shum et al. |
| 2011/0204763 A1 | 8/2011 | Shum et al. |
| 2011/0204779 A1 | 8/2011 | Shum et al. |
| 2011/0204780 A1 | 8/2011 | Shum et al. |
| 2011/0215348 A1 | 9/2011 | Trottier et al. |
| 2011/0216795 A1 | 9/2011 | Hsu et al. |
| 2011/0247556 A1 | 10/2011 | Raring et al. |
| 2011/0266552 A1 | 11/2011 | Tu et al. |
| 2011/0279054 A1 | 11/2011 | Katona et al. |
| 2011/0281422 A1 | 11/2011 | Wang et al. |
| 2011/0286484 A1 | 11/2011 | Raring et al. |
| 2011/0291548 A1 | 12/2011 | Nguyen The et al. |
| 2011/0315999 A1 | 12/2011 | Sharma et al. |
| 2011/0317397 A1 | 12/2011 | Trottier et al. |
| 2012/0007102 A1 | 1/2012 | Feezell et al. |
| 2012/0043552 A1 | 2/2012 | David et al. |
| 2012/0104359 A1 | 5/2012 | Felker et al. |
| 2012/0104412 A1 | 5/2012 | Zhong et al. |
| 2012/0135553 A1 | 5/2012 | Felker et al. |
| 2012/0178198 A1 | 7/2012 | Raring et al. |
| 2012/0187371 A1 | 7/2012 | Raring et al. |
| 2012/0187412 A1 | 7/2012 | D'Evelyn et al. |
| 2012/0199841 A1 | 8/2012 | Batres et al. |
| 2012/0235201 A1 | 9/2012 | Shum |
| 2012/0288974 A1 | 11/2012 | Sharma et al. |
| 2012/0299492 A1 | 11/2012 | Egawa et al. |
| 2012/0313541 A1 | 12/2012 | Egawa et al. |
| 2012/0314398 A1 | 12/2012 | Raring et al. |
| 2013/0016750 A1 | 1/2013 | Raring et al. |
| 2013/0022064 A1 | 1/2013 | Raring et al. |
| 2013/0022758 A1 | 1/2013 | Trottier |
| 2013/0026483 A1 | 1/2013 | Sharma et al. |
| 2013/0043799 A1 | 2/2013 | Siu et al. |
| 2013/0044782 A1 | 2/2013 | Raring |
| 2013/0064261 A1 | 3/2013 | Sharma et al. |
| 2013/0112987 A1 | 5/2013 | Fu et al. |
| 2013/0126902 A1 | 5/2013 | Isozaki et al. |
| 2013/0234108 A1 | 9/2013 | David et al. |
| 2013/0313516 A1 | 11/2013 | David et al. |
| 2013/0322089 A1 | 12/2013 | Martis et al. |

FOREIGN PATENT DOCUMENTS

| | | |
|---|---|---|
| CN | 1702836 | 11/2005 |
| CN | 101099245 | 1/2008 |
| CN | 101171692 | 4/2008 |
| EP | 2267190 | 12/2010 |
| EP | 2381490 | 10/2011 |
| JP | 03-287770 | 12/1991 |
| JP | 06-334215 | 12/1994 |
| JP | 1997-036430 | 2/1997 |
| JP | 1997-082587 | 3/1997 |
| JP | 1999-340507 | 12/1999 |
| JP | 1999-340576 | 12/1999 |
| JP | 2001-160627 | 6/2001 |
| JP | 2001-177146 | 6/2001 |
| JP | 2002-185085 | 6/2002 |
| JP | 2003-031844 | 1/2003 |
| JP | 2000-294883 | 2/2004 |
| JP | 2006-147933 | 6/2006 |
| JP | 2006-173621 | 6/2006 |
| JP | 2007-110090 | 4/2007 |
| JP | 2007-173467 | 7/2007 |
| JP | 2008-084973 | 4/2008 |
| JP | 2008-172040 | 7/2008 |
| JP | 2008-311640 | 12/2008 |
| WO | WO 2006/062880 | 6/2006 |
| WO | WO 2006/123259 | 11/2006 |
| WO | WO 2008/041521 | 4/2008 |
| WO | WO 2009/001039 | 12/2008 |
| WO | WO 2009/013695 | 1/2009 |
| WO | WO 2009/066430 | 5/2009 |
| WO | WO 2010/138923 | 2/2010 |
| WO | WO 2010/119375 | 10/2010 |
| WO | WO 2010/120819 | 10/2010 |
| WO | WO 2011/010774 | 1/2011 |
| WO | WO 2011/034226 | 3/2011 |

OTHER PUBLICATIONS

Adesida et al., 'Characteristics of chemically assisted ion beam etching of gallium nitride', Applied Physics Letters, vol. 65, No. 7, 1994, p. 889-891.

Aguilar, 'Ohmic n-contacts to Gallium Nitride Light Emitting Diodes', National Nanotechnologhy Infrastructure Network, 2007, p. 56-81.

Baker et al., 'Characterization of Planar Semipolar Gallium Nitride Films on Spinel Substrates', Japanese Journal of Applied Physics, vol. 44, No. 29, 2005, p. L920-L922.

Behfar et al., 'Progress in Etched Facet Technology for GaN and Blue Lasers', Proc. of SPIE., vol. 6473, 64731F, 2007, p. 1-8.

Benke et al., 'Uncertainty in Health Risks from Artificial Lighting due to Disruption of Circadian Rythm and Melatonin Secretion: A Review', Human and Ecological Risk Assessment: An International Journal, vol. 19, No. 4, 2013, p. 916-929.

Bockowski, 'Directional crystallization of GaN on high-pressure solution grown substrates by growth from solution and HVPE', Journal of Crystal Growth, 2002, vol. 246, 3-4, p. 194-206.

Cich et al., 'Bulk GaN based violet light-emitting diodes with high efficiency at very high current density', Applied Physics Letters, Nov. 29, 2012, p. 223509-1-223509-3.

Chinese Office Action From Chinese Patent Application No. 200980134723.8 dated Nov. 1, 2012, 22 pages. (With Translation).

Csuti et al., 'Color-matching experiments with RGB-LEDs', Color Research and Application, vol. 33, No. 2, 2008, p. 1-9.

Davis et al., 'Color quality scale', Optical Engineering, vol. 49, No. 3, Mar. 2010, p. 033602-1-036602-16.

Enya, '531nm Green Lasing of InGaN Based Laser Diodes on Semi-Polar {20-21} Free-Standing GaN Substrates', Applied Physics Express, Jul. 17, 2009, vol. 2, p. 082101.

Founta et al., 'Anisotropic Morphology of Nonpolar a-Plane GaN Quantum Dots and Quantum Wells', Journal of Applied Physics, vol. 102, vol. 7, 2007, p. 074304-1-074304-6.

Franssila, 'Tools for CVD and Epitaxy', Introduction to Microfabrication, 2004, p. 329-336.

Hanifin et al., 'Photoreception for Circadian, Neuroendocrine, and Neurobehavioral Regulation', Journal of Physiological Anthropology, vol. 26, 2007, p. 87-94.

Haskell et al., 'Defect Reduction in (1100) m-plane gallium nitride via lateral epitaxial overgrowth by hydride vapor phase epitaxy', Applied Physics Letters 86, 111917 (2005), pp. 1-3.

Hiramatsu et al., 'Fabrication and characterization of low defect density GaN using facet-controlled epitaxial lateral overgrowth (Facelo)', Journal of Crystal Growth, vol. 221, No. 1-4, Dec. 2000, p. 316-326.

Houser et al., 'Review of measures for light-source color rendition and considerations for a two-measure system for characterizing color rendition', Optics Express, vol. 21, No. 8, Apr. 19, 2013, p. 10393-10411.

Iso et al., 'High Brightness Blue InGaN/GaN Light Emitting Diode on Nonpolar m-Plane Bulk GaN Substrate', Japanese Journal of Applied Physics, vol. 46, No. 40, 2007, pp. L960-L962.

Paper and Board Determination of CIE Whiteness, D65/10 (outdoor daylight)', ISO International Standard 11475:2004E (2004), 18 pages.

(56) References Cited

OTHER PUBLICATIONS

Kelly et al., 'Large Free-Standing GaN Substrates by Hydride Vapor Phase Epitay and Laser-Induced Liftoff', Japanese Journal of Applied Physics, vol. 38, 1999, p. L217-L219.
Khan, 'Cleaved Cavity Optically Pumped InGaN-GaN Laser Grown on Spinel Substrates', Applied Physics Letters, vol. 69, No. 16, 1996, pp. 2417-2420.
Kim et al., 'High Brightness Light Emitting Diodes Using Dislocation-Free Indium Gallium Nitride/Gallium Nitride Multiquantum-Well Nanorod Arrays', Nano Letters, vol. 4, No. 6, 2004, p. 1059-1062.
Lin et al., 'Influence of Separate Confinement Heterostructure Layer on Carrier Distribution in InGaAsP Laser Diodes With Nonidentical Multiple Quantum Wells', Japanese Journal of Applied Physics, vol. 43, No. 10, 2004, p. 7032-7035.
Lu et al., 'Etch-Pits of GaN Films with Different Etching Methods', Journal of the Korean Physical Society, vol. 45, Dec. 2004, p. 7032-7035.
Motoki et al., 'Dislocation reduction in GaN crystal by advanced-DEEP', Journal of Crystal Growth, vol. 305, Apr. 1, 2007, p. 377-383.
Narendran et al., 'Color Rendering Properties of LED Light Sources', Solid State Lighting II: Proceedings of SPIE, 2002, 8 pages.
Okamoto et al., 'Continuous-Wave Operation of m-Plane InGaN Multiple Quantum Well Laser Diodes', Japanese Journal of Applied Physics, vol. 46, No. 9, 2007, p. L187-L189.
Okamoto et al., 'High-Efficiency Continuous-Wave Operation of Blue-Green Laser Diodes Based on Nonpolar mPlane Gallium Nitride', The Japan Society of Applied Physics, Applied Physics, Express 1, 2008, p. 072201-1-072201-3.
Park, 'Crystal Orientation Effects on Electronic Properties of Wurtzite InGaN/GaN Quantum Wells', Journal of Applied Physics, vol. 91, No. 12, 2002, p. 9903-9908.
International Search Report of PCT Application No. PCT/US2011/023622, dated Apr. 1, 2011, 2 pages total.
International Preliminary Report & Written Opinion of PCT Application No. PCT/US2011/037792, dated Dec. 6, 2012, 8 pages total.
International Search Report of PCT Application No. PCT/US2011/048499, dated Feb. 14, 2012, 2 pages total.
International Preliminary Report & Written Opinion of PCT Application No. PCT/US2011/060030 dated Mar. 21, 2012, 11 pages total.
International Search Report & Written Opinion of PCT Application No. PCT/US2013/029453, dated Jul. 25, 2013, 11 pages total.
http://www.philipslumileds.com/products/luxeon-flash, 'LUXEON Flash', Philips Lumileds, Aug. 8, 2013, p. 1-2.
Porowski et al., 'Thermodynamical Properties of III-V Nitrides and Crystal Growth of GaN at High N2 Pressure', Journal of Crystal Growth, 1997, vol. 178, p. 174-188.
Rea et al., 'White Lighting', COLOR Research and Application, vol. 38, No. 2, Sep. 3, 2011, p. 82-92.
Rickert et al., 'n-GaN Surface Treatments for Metal Contacts Studied Via X-ray Photoemission Spectroscopy', Applied Physics Letters, vol. 80, No. 2, Jan. 14, 2002, p. 204-206.
Romanov et al., 'Strain-Induced Polarization in Wurtzite III-Nitride Semipolar Layers', Journal of Applied Plyisics, vol. 100, 2006, p. 023522-1 through 023522-10.
Sato et al., 'High Power and High Efficiency Semipolar InGaN Light Emitting Diodes', Journal of Light and Visible Environment, vol. 32, No. 2, Dec. 13, 2007, p. 57-60.
Sato et al., 'Optical Properties of Yellow Light-Emitting Diodes Grown on Semipolar (1122) Bulk GaN Substrate', Applied Physics Letters, vol. 92, No. 22, 2008, p. 221110-1-221110-3.
Schoedl, 'Facet Degradation of GaN Heterostructure Laser Diodes', Journal of Applied Physics, vol. 97, issue 12, 2005, p. 123102-1-123102-8.
Selvanathan et al., 'Investigation of Surface Treatment Schemes on n-type GaN and A10.20Ga0.80N', Journal of Vacuum Science and Technology B, vol. 23, No. 6, May 10, 2005, p. 2583-2544.
Semendy et al., 'Observation and Study of Dislocation Etch Pits in Molecular Beam Epitaxy Grown Gallium Nitride with the use of Phosphoric Acid and Molten Potassium Hydroxide', Army Research Laboratory, Jun. 2007, 18 pages.
Tyagi et al., 'Semipolar (1011) InGaN/GaN Laser Diodes on Bulk GaN Substrates', Japanese Journal of Applied Physics, vol. 46, No. 19, 2007, p. L444-L445.
Communication from the German Patent Office re 11 2010 003 697.7 dated Apr. 11, 2013, (6 pages).
Communication from the Japanese Patent Office re 2012-529905 dated Apr. 19, 2013, (4 pages).
Communication from the Japanese Patent Office re 2013515583 dated Feb. 27, 2014, (2 pages).
Communication from the German Patent Office re 11 2011 102 386.3 dated May 14, 2013, (93 pages).
Communication from the Korean Patent Office re 10-2012-7009980 dated Apr. 15, 2013, (6 pages).
Communication from the Japanese Patent Office re 2012-529969, dated Oct. 15, 2013, (6 pages).
Communication from the German Patent Office re 048499_11 2011 102 386.3 dated May 14, 2013 (8 pages).
Weaver et al., 'Optical Properties of Selected Elements', Handbook of Chemistry and Physics, 94th Edition, 2013-2014, p. 12-126-12-150.
Whitehead et al., 'A Monte Carlo method for assessing color rendering quality with possible application to color rendering standards', Color Research and Application, vol. 37, No. 1, Feb. 2012, p. 13-22.
Xu et al., 'Acid Etching for accurate determination of dislocation density in GaN', J. Electronic Materials, 2002, vol. 31, p. 402-405.
Xu et al., 'Growth and Characterization of Low Defect GaN by Hydride Vapor Phase Epitaxy', Journal of Crystal Growth, vol. 246, Dec. 2002, p. 223-229 (Abstract).
Yoshizumi et al., 'Continuous-Wave Operation of 520nm Green InGaN-Based Laser Diodes on Semi-Polar {2021} GaN Substrates', Applied Physics Express, vol. 2, 2009, p. 092101-1-092101-3.
Zhong et al., 'Demonstration of High Power Blue-Green Light Emitting Diode on Semipolar (1122) Bulk GaN Substrate', Electronics Letters, vol. 43, No. 15, 2007, p. 825-826.
USPTO Office Action for U.S. Appl. No. 12/481,543 dated Jun. 27, 2011 (9 pages).
USPTO Office Action for U.S. Appl. No. 12/482,440 dated Feb. 23, 2011 (5 pages).
USPTO Office Action for U.S. Appl. No. 12/482,440 dated Aug. 12, 2011 (6 pages).
USPTO Office Action for U.S. Appl. No. 12/484,924 dated Apr. 14, 2011 (11 pages).
USPTO Office Action for U.S. Appl. No. 12/484,924 dated Oct. 31, 2011 (10 pages).
USPTO Office Action for U.S. Appl. No. 12/491,169 dated Oct. 22, 2010 (9 pages).
USPTO Office Action for U.S. Appl. No. 12/491,169 dated May 11, 2011 (9 pages).
USPTO Office Action for U.S. Appl. No. 12/491,176 dated Mar. 1, 2012 (9 pages).
USPTO Office Action for U.S. Appl. No. 12/491,176 dated Jul. 19, 2012 (13 pages).
USPTO Office Action for U.S. Appl. No. 12/491,176 dated Nov. 22, 2013 (14 pages).
USPTO Office Action for U.S. Appl. No. 12/497,289 dated Feb. 2, 2012 (6 pages).
USPTO Notice of Allowance for U.S. Appl. No. 12/497,289 dated May 22, 2012 (7 pages).
USPTO Office Action for U.S. Appl. No. 12/502,058 dated Dec. 8, 2010 (14 pages).
USPTO Office Action for U.S. Appl. No. 12/502,058 dated Aug. 19, 2011 (12 pages).
USPTO Notice of Allowance for U.S. Appl. No. 12/502,058 dated Apr. 16, 2012 (10 pages).
USPTO Notice of Allowance for U.S. Appl. No. 12/502,058 dated Jul. 19, 2012 (8 pages).
USPTO Office Action for U.S. Appl. No. 12/534,829 dated Apr. 19, 2011 (8 pages).

(56) References Cited

OTHER PUBLICATIONS

USPTO Notice of Allowance for U.S. Appl. No. 12/534,829 dated Oct. 28, 2011 (7 pages).
USPTO Notice of Allowance for U.S. Appl. No. dated Dec. 5, 2011 (7 pages).
USPTO Notice of Allowance for U.S. Appl. No. 12/534,829 dated Dec. 21, 2011 (4 pages).
USPTO Office Action for U.S. Appl. No. 12/534,838 dated May 3, 2011 (11 pages).
USPTO Office Action for U.S. Appl. No. 12/534,838 dated Jan. 13, 2012 (12 pages).
USPTO Office Action for U.S. Appl. No. 12/534,838 dated Mar. 20, 2012 (12 pages).
USPTO Notice of Allowance for U.S. Appl. No. 12/534,838 dated Jun. 8, 2012 (8 pages).
USPTO Office Action for U.S. Appl. No. 12/569,841 dated Dec. 23, 2011 (12 pages).
USPTO Office Action for U.S. Appl. No. 12/569,841 dated Mar. 26, 2013 (17 pages).
USPTO Office Action for U.S. Appl. No. 12/569,841 dated Aug. 13, 2013 (20 pages).
USPTO Office Action for U.S. Appl. No. 12/569,841 dated Feb. 14, 2014 (20 pages).
USPTO Office Action for U.S. Appl. No. 12/569,844 dated Oct. 12, 2012 (12 pages).
USPTO Notice of Allowance for U.S. Appl. No. 12/569,844 dated Mar. 7, 2013 (9 pages).
USPTO Office Action for U.S. Appl. No. 12/573,820 dated Mar. 2, 2011 (18 pages).
USPTO Office Action for U.S. Appl. No. 12/573,820 dated Oct. 11, 2011 (22 pages).
USPTO Office Action for U.S. Appl. No. 12/634,665 dated Mar. 12, 2012 (9 pages).
USPTO Notice of Allowance for U.S. Appl. No. 12/720,593 dated Jul. 11, 2012 (7 pages).
USPTO Office Action for U.S. Appl. No. 12/749,466 dated Jun. 29, 2011 (19 pages).
USPTO Office Action for U.S. Appl. No. 12/749,466 dated Feb. 3, 2012 (14 pages).
USPTO Office Action for U.S. Appl. No. 12/749,466 dated Jul. 3, 2012 (18 pages).
USPTO Notice of Allowance for U.S. Appl. No. 12/749,466 dated Jan. 2, 2013 (8 pages).
USPTO Office Action for U.S. Appl. No. 12/749,476 dated Apr. 11, 2011 (14 pages).
USPTO Office Action for U.S. Appl. No. 12/749,476 dated Nov. 8, 2011 (11 pages).
USPTO Notice of Allowance for U.S. Appl. No. 12/749,476 dated May 4, 2012 (8 pages).
USPTO Notice of Allowance for U.S. Appl. No. 12/749,476 dated Jun. 26, 2012 (8 pages).
USPTO Notice of Allowance for U.S. Appl. No. 12/754,886 dated May 17, 2012 (19 pages).
USPTO Notice of Allowance for U.S. Appl. No. 12/754,886 dated Jun. 5, 2012 (16 pages).
USPTO Notice of Allowance for U.S. Appl. No. 12/754,886 dated Jun. 20, 2012 (14 pages).
USPTO Office Action for U.S. Appl. No. 12/759,273 dated Nov. 21, 2011 (9 pages).
USPTO Office Action for U.S. Appl. No. 12/759,273 dated Jun. 26, 2012 (10 pages).
USPTO Office Action for U.S. Appl. No. 12/762,269 dated Oct. 12, 2011 (11 pages).
USPTO Notice of Allowance for U.S. Appl. No. 12/762,269 dated Apr. 23, 2012 (8 pages).
USPTO Office Action for U.S. Appl. No. 12/762,271 dated Dec. 23, 2011 (11 pages).
USPTO Office Action for U.S. Appl. No. 12/762,271 dated Jun. 6, 2012 (12 pages).
USPTO Notice of Allowance for U.S. Appl. No. 12/762,271 dated Aug. 8, 2012 (8 pages).
USPTO Notice of Allowance for U.S. Appl. No. 12/762,278 dated Nov. 7, 2011 (10 pages).
USPTO Office Action for U.S. Appl. No. 12/778,718 dated Nov. 25, 2011 (11 pages).
USPTO Notice of Allowance for U.S. Appl. No. 12/778,718 dated Apr. 3, 2012 (13 pages).
USPTO Notice of Allowance for U.S. Appl. No. 12/778,718 dated Jun. 13, 2012 (7 pages).
USPTO Office Action for U.S. Appl. No. 12/785,953 dated Apr. 12, 2012 (11 pages).
USPTO Office Action for U.S. Appl. No. 12/785,953 dated Jan. 11, 2013 (14 pages).
USPTO Office Action for U.S. Appl. No. 12/785,953 dated Oct. 3, 2013 (10 pages).
USPTO Office Action for U.S. Appl. No. 12/787,343 dated Dec. 17, 2012 (5 pages).
USPTO Notice of Allowance for U.S. Appl. No. 12/787,343 dated Jun. 10, 2013 (9 pages).
USPTO Office Action for U.S. Appl. No. 12/789,303 dated Sep. 24, 2012 (19 pages).
USPTO Notice of Allowance for U.S. Appl. No. 12/789,303 dated Dec. 21, 2012 (5 pages).
USPTO Office Action for U.S. Appl. No. 12/859,153 dated Sep. 25, 2012 (21 pages).
USPTO Office Action for U.S. Appl. No. 12/859,153 dated Feb. 26, 2013 (23 pages).
USPTO Office Action for U.S. Appl. No. 12/861,765 dated Jul. 2, 2012 (11 pages).
USPTO Office Action for U.S. Appl. No. 12/861,765 dated Mar. 7, 2013 (12 pages).
USPTO Office Action for U.S. Appl. No. 12/861,765 dated Sep. 17, 2013 (10 pages).
USPTO Office Action for U.S. Appl. No. 12/868,441 dated Apr. 30, 2012 (11 pages).
USPTO Office Action for U.S. Appl. No. 12/868,441 dated Dec. 18, 2012 (33 pages).
USPTO Office Action for U.S. Appl. No. 12/879,784 dated Jan. 25, 2012 (6 pages).
USPTO Notice of Allowance for U.S. Appl. No. 12/879,784 dated Apr. 3, 2012 (7 pages).
USPTO Office Action for U.S. Appl. No. 12/880,803 dated Feb. 22, 2012 (8 pages).
USPTO Notice of Allowance for U.S. Appl. No. 12/880,803 dated Jul. 18, 2012 (5 pages).
USPTO Office Action for U.S. Appl. No. 12/880,889 dated Feb. 27, 2012 (12 pages).
USPTO Office Action for U.S. Appl. No. 12/880,889 dated Sep. 19, 2012 (12 pages).
USPTO Office Action for U.S. Appl. No. 12/883,093 dated Mar. 13, 2012 (9 pages).
USPTO Office Action for U.S. Appl. No. 12/883,093 dated Aug. 3, 2012 (12 pages).
USPTO Notice of Allowance for U.S. Appl. No. 12/883,093 dated Nov. 21, 2012 (12 pages).
USPTO Office Action for U.S. Appl. No. 12/883,652 dated Apr. 17, 2012 (7 pages).
USPTO Office Action for U.S. Appl. No. 12/883,652 dated Jan. 11, 2013 (11 pages).
USPTO Office Action for U.S. Appl. No. 12/884,993 dated Mar. 16, 2012 (12 pages).
USPTO Office Action for U.S. Appl. No. 12/884,993 dated Aug. 2, 2012 (14 pages).
USPTO Notice of Allowance for U.S. Appl. No. 12/884,993 dated Nov. 26, 2012 (6 pages).
USPTO Office Action for U.S. Appl. No. 12/887,207 dated May 23, 2012 (13 pages).
USPTO Office Action for U.S. Appl. No. 12/887,207 dated Jan. 7, 2013 (19 pages).
USPTO Office Action for U.S. Appl. No. 12/887,207 dated May 10, 2013 (19 pages).

(56) References Cited

OTHER PUBLICATIONS

USPTO Office Action for U.S. Appl. No. 12/887,207 dated Aug. 23, 2013 (17 pages).
USPTO Office Action for U.S. Appl. No. 12/914,789 dated Oct. 12, 2011 (7 pages).
USPTO Office Action for U.S. Appl. No. 12/914,789 dated Feb. 24, 2012 (8 pages).
USPTO Notice of Allowance for U.S. Appl. No. 12/914,789 dated May 17, 2012 (5 pages).
USPTO Office Action for U.S. Appl. No. 12/936,238 dated Aug. 30, 2012 (11 pages).
USPTO Office Action for U.S. Appl. No. 12/936,238 dated Jan. 30, 2013 (12 pages).
USPTO Notice of Allowance for U.S. Appl. No. 12/936,238 dated Apr. 16, 2013 (9 pages).
USPTO Office Action for U.S. Appl. No. 12/942,817 dated Feb. 20, 2013 (11 pages).
USPTO Office Action for U.S. Appl. No. 12/995,946 dated Mar. 28, 2012 (17 pages).
USPTO Office Action for U.S. Appl. No. 12/995,946 dated Jan. 29, 2013 (25 pages).
USPTO Office Action for U.S. Appl. No. 12/995,946 dated Aug. 2, 2013 (15 pages).
USPTO Office Action for U.S. Appl. No. 13/012,674 dated Jan. 17, 2014 (15 pages).
USPTO Office Action for U.S. Appl. No. 13/014,622 dated Nov. 28, 2011 (13 pages).
USPTO Office Action for U.S. Appl. No. 13/014,622 dated Apr. 30, 2012 (13 pages).
USPTO Office Action for U.S. Appl. No. 13/019,521 dated Feb. 3, 2012 (12 pages).
USPTO Office Action for U.S. Appl. No. 13/019,521 dated Nov. 14, 2012 (11 pages).
USPTO Office Action for U.S. Appl. No. 13/019,897 dated Mar. 30, 2012 (14 pages).
USPTO Office Action for U.S. Appl. No. 13/019,897 dated Jan. 16, 2013 (7 pages).
USPTO Office Action for U.S. Appl. No. 13/019,897 dated Dec. 2, 2013 (17 pages).
USPTO Office Action for U.S. Appl. No. 13/019,897 dated Jun. 12, 2014 (8 pages).
USPTO Office Action for U.S. Appl. No. 13/025,833 dated Jul. 12, 2012 (15 pages).
USPTO Office Action for U.S. Appl. No. 13/046,565 dated Nov. 7, 2011 (16 pages).
USPTO Office Action for U.S. Appl. No. 13/046,565 dated Feb. 2, 2012 (16 pages).
USPTO Office Action for U.S. Appl. No. 13/046,565 dated Apr. 13, 2012 (39 pages).
USPTO Office Action for U.S. Appl. No. 13/046,565 dated Jul. 19, 2012 (23 pages).
USPTO Notice of Allowance for U.S. Appl. No. 13/108,645 dated Jan. 28, 2013 (8 pages).
USPTO Office Action for U.S. Appl. No. 13/114,806 dated Apr. 12, 2013 (21 pages).
USPTO Office Action for U.S. Appl. No. 13/135,087 dated Sep. 27, 2013 (7 pages).
USPTO Notice of Allowance for U.S. Appl. No. 13/163,482 dated Jul. 31, 2012 (5 pages).
USPTO Office Action for U.S. Appl. No. 13/179,346 dated Aug. 17, 2012 (17 pages).
USPTO Office Action for U.S. Appl. No. 13/179,346 dated Dec. 13, 2012 (20 pages).
USPTO Office Action for U.S. Appl. No. 13/210,769 dated Apr. 3, 2013 (13 pages).
USPTO Office Action for U.S. Appl. No. 13/210,769 dated Oct. 28, 2013 (9 pages).
USPTO Office Action for U.S. Appl. No. 13/211,145 dated Oct. 17, 2012 (20 pages).
USPTO Office Action for U.S. Appl. No. 13/211,145 dated Apr. 19, 2013 (24 pages).
USPTO Office Action for U.S. Appl. No. 13/211,145 dated Aug. 7, 2013 (23 pages).
USPTO Office Action for U.S. Appl. No. 13/281,221 dated Jun. 21, 2013 (6 pages).
USPTO Notice of Allowance for U.S. Appl. No. 13/281,221 dated Nov. 12, 2013 (10 pages).
USPTO Office Action for U.S. Appl. No. 13/291,922 dated Feb. 20, 2013 (9 pages).
USPTO Office Action for U.S. Appl. No. 13/291,922 dated Jun. 18, 2013 (9 pages).
USPTO Notice of Allowance for U.S. Appl. No. 13/298,905 dated Jun. 11, 2013 (8 pages).
USPTO Office Action for U.S. Appl. No. 13/328,978 dated May 15, 2013 (24 pages).
USPTO Office Action for U.S. Appl. No. 13/328,978 dated Sep. 26, 2013 (25 pages).
USPTO Notice of Allowance for U.S. Appl. No. 13/328,978 dated Mar. 18, 2014 (13 pages).
USPTO Office Action for U.S. Appl. No. 13/354,639 dated Nov. 7, 2012 (11 pages).
USPTO Notice of Allowance for U.S. Appl. No. 13/354,639 dated Dec. 14, 2012 (8 pages).
USPTO Office Action for U.S. Appl. No. 13/357,315 dated Oct. 15, 2013 (12 pages).
USPTO Office Action for U.S. Appl. No. 13/425,354 dated Feb. 14, 2013 (12 pages).
USPTO Office Action for U.S. Appl. No. 13/465,976 dated Aug. 16, 2012 (16 pages).
USPTO Office Action for U.S. Appl. No. 13/465,976 dated Dec. 20, 2012 (16 pages).
USPTO Office Action for U.S. Appl. No. 13/482,956 dated Aug. 17, 2012 (9 pages).
USPTO Office Action for U.S. Appl. No. 13/482,956 dated Feb. 14, 2013 (15 pages).
USPTO Office Action for U.S. Appl. No. 13/482,956 dated Jul. 22, 2013 (16 pages).
USPTO Notice of Allowance for U.S. Appl. No. 13/482,956 dated Oct. 28, 2013 (9 pages).
USPTO Office Action for U.S. Appl. No. 13/548,635 dated Jun. 14, 2013 (5 pages).
USPTO Notice of Allowance for U.S. Appl. No. 13/548,635 dated Sep. 16, 2013 (6 pages).
USPTO Office Action for U.S. Appl. No. 13/548,770 dated Mar. 12, 2013 (5 pages).
USPTO Notice of Allowance for U.S. Appl. No. 13/548,770 dated Jun. 25, 2013 (6 pages).
USPTO Office Action for U.S. Appl. No. 13/600,988 dated Jul. 18, 2013 (12 pages).
USPTO Notice of Allowance for U.S. Appl. No. 13/600,988 dated Sep. 16, 2013 (9 pages).
USPTO Office Action for U.S. Appl. No. 13/606,894 dated Feb. 5, 2013 (7 pages).
USPTO Notice of Allowance for U.S. Appl. No. 13/606,894 dated May 24, 2013 (9 pages).
USPTO Office Action for U.S. Appl. No. 13/629,366 dated Oct. 31, 2013 (7 pages).
USPTO Office Action for U.S. Appl. No. 13/723,968 dated Nov. 29, 2013 (23 pages).
USPTO Office Action for U.S. Appl. No. 13/781,633 dated Mar. 6, 2014 (11 pages).

* cited by examiner

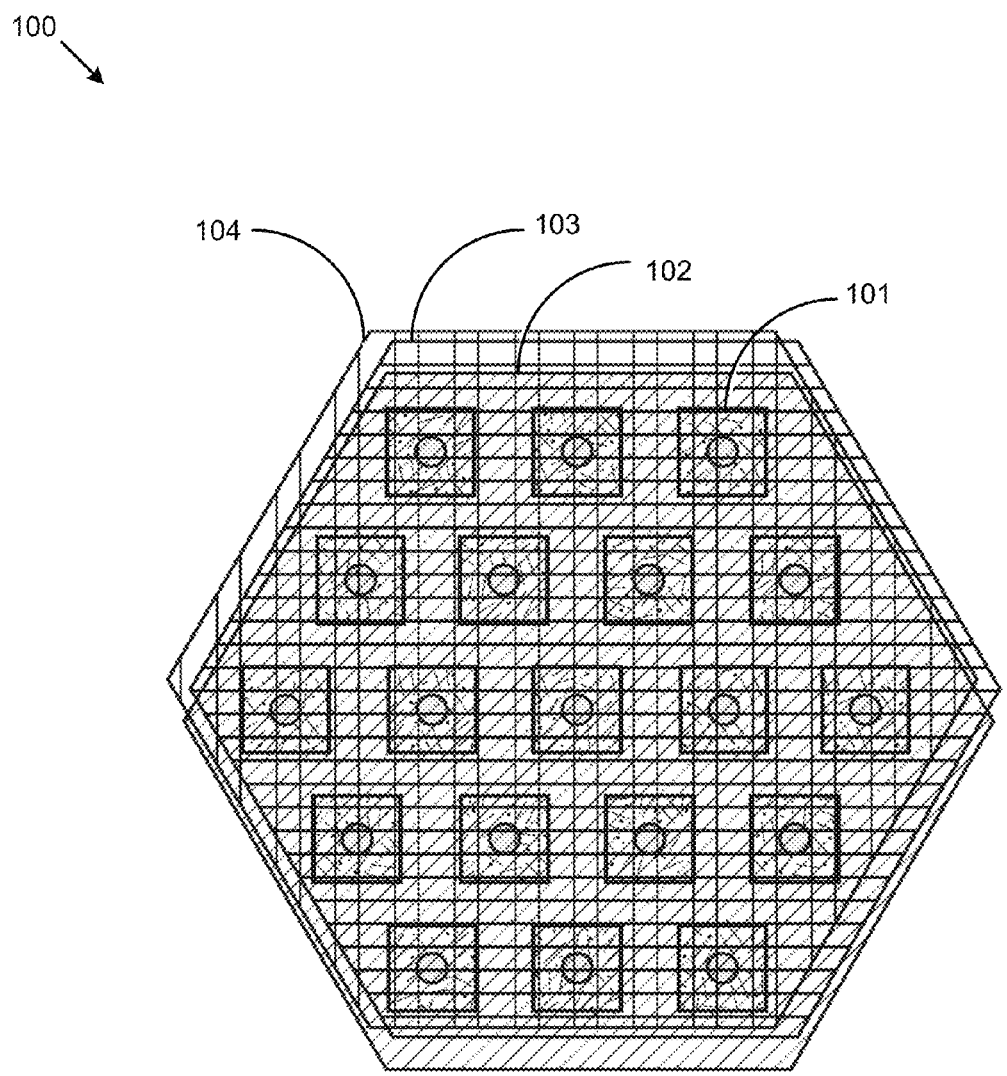
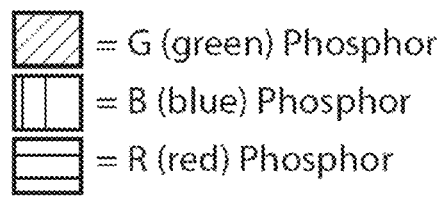
FIG. 1A

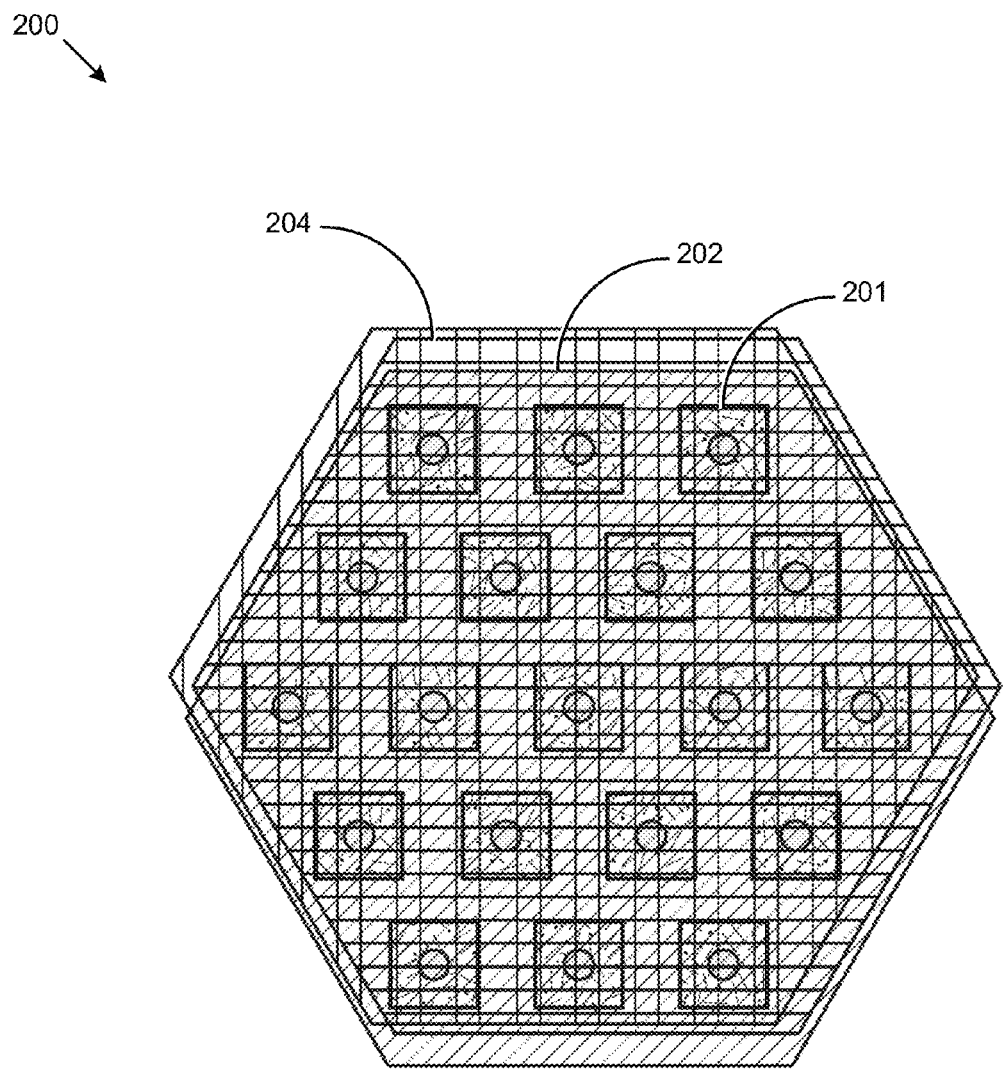
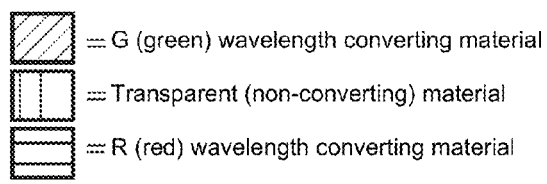
= G (green) wavelength converting material
= Transparent (non-converting) material
= R (red) wavelength converting material
FIG. 2

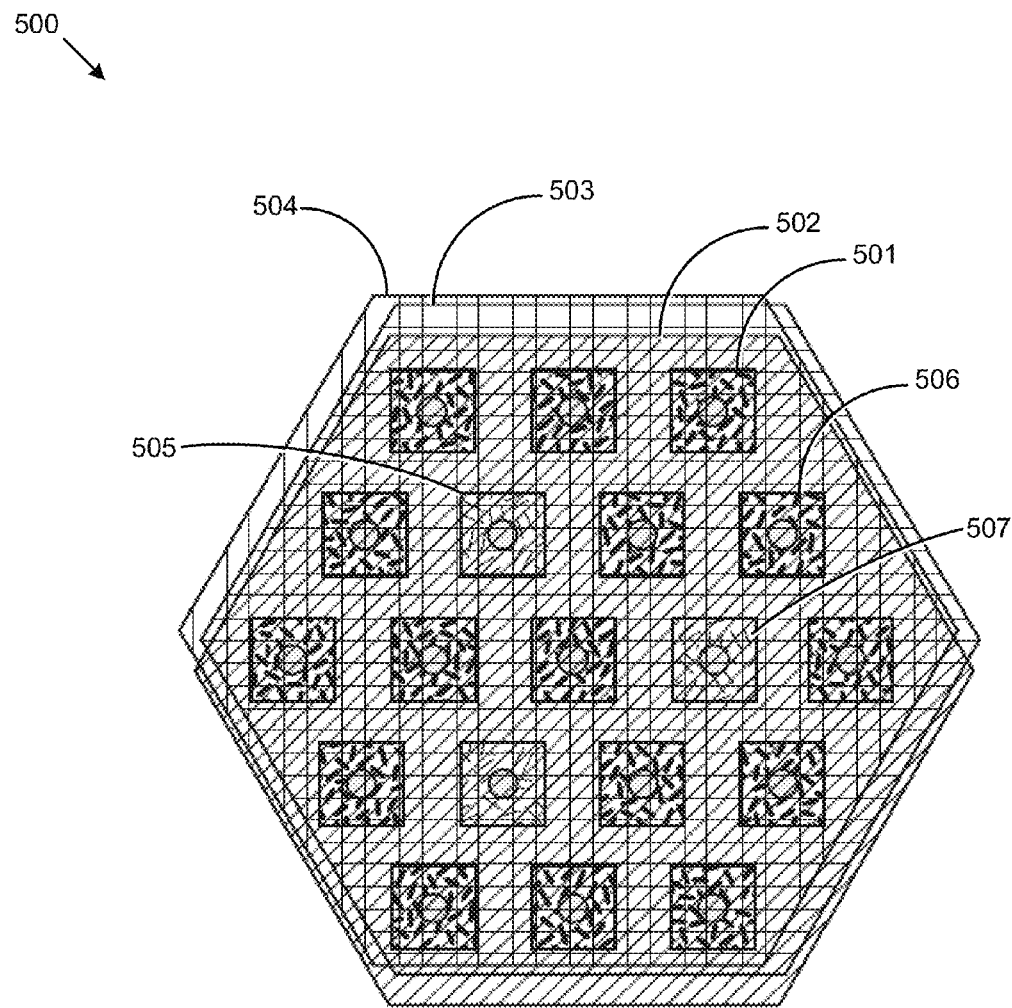
 = "long" violet    = "short" violet
 = G (green) light emitting wavelength converting material
 = B (blue) light emitting wavelength converting material
 = R (red) light emitting wavelength converting material
FIG. 5

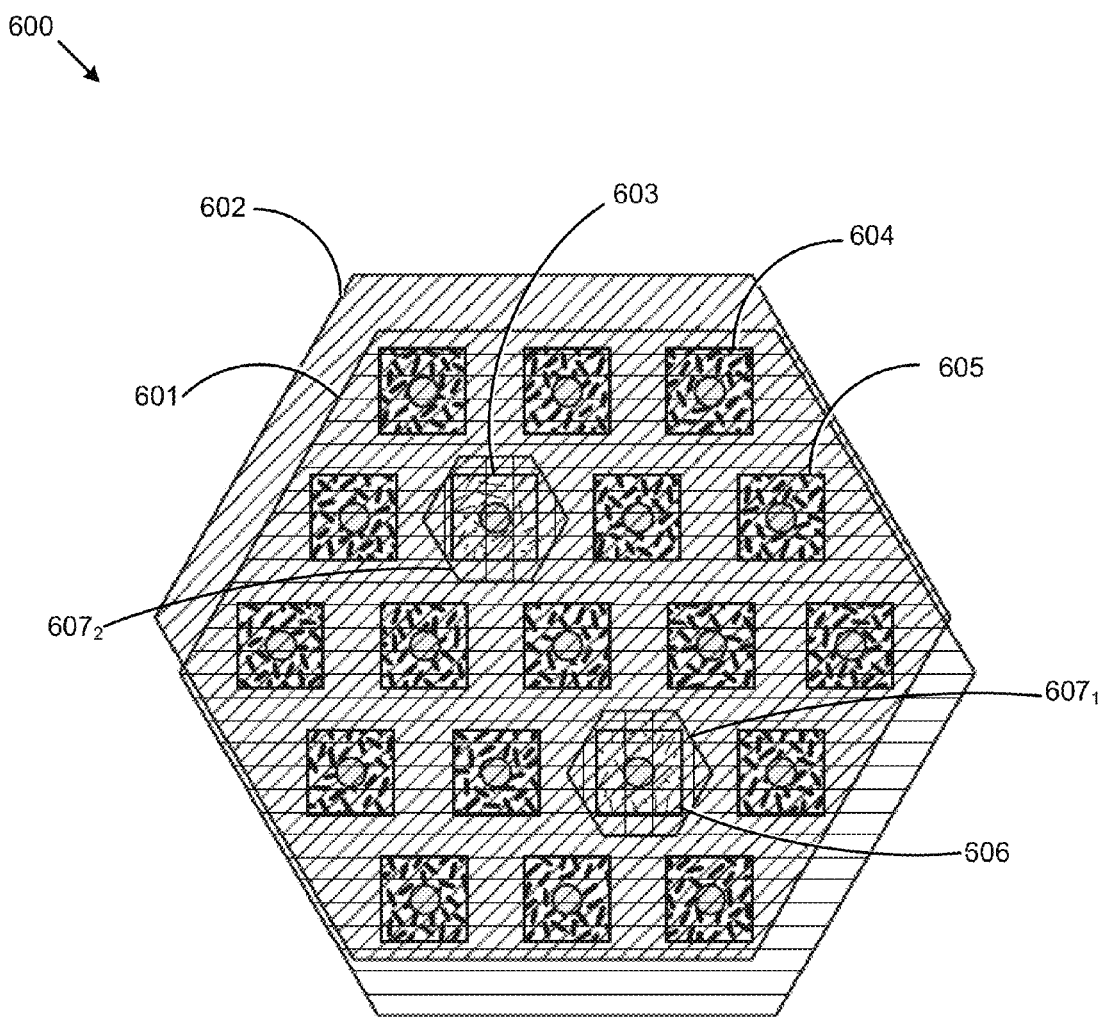
 = "long" violet     = "short" violet     = blue
 = G (green) light emitting wavelength converting material
 = B (blue) light emitting wavelength converting material
 = R (red) light emitting wavelength converting material
FIG. 6

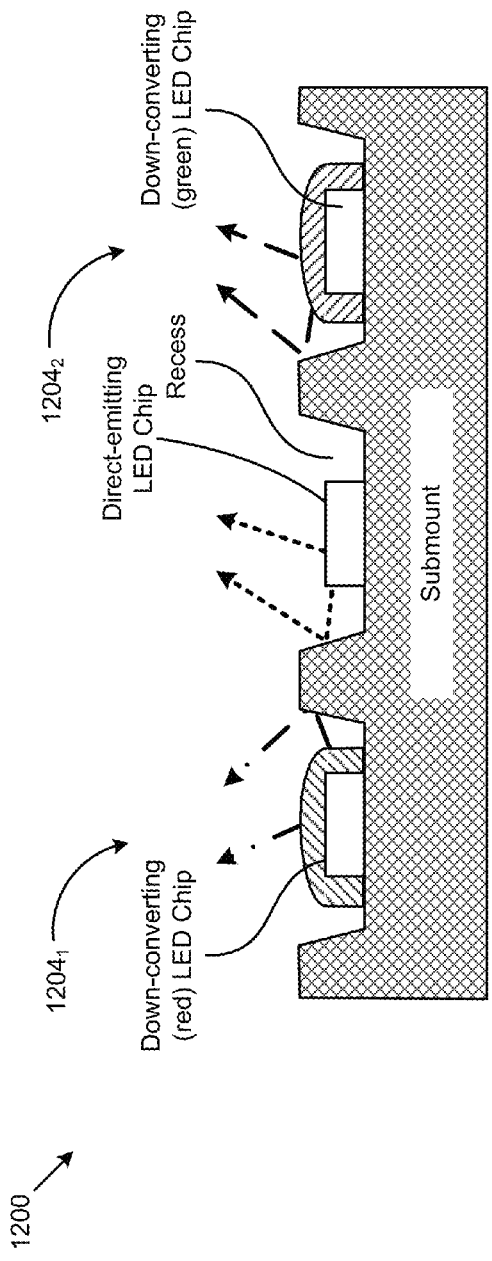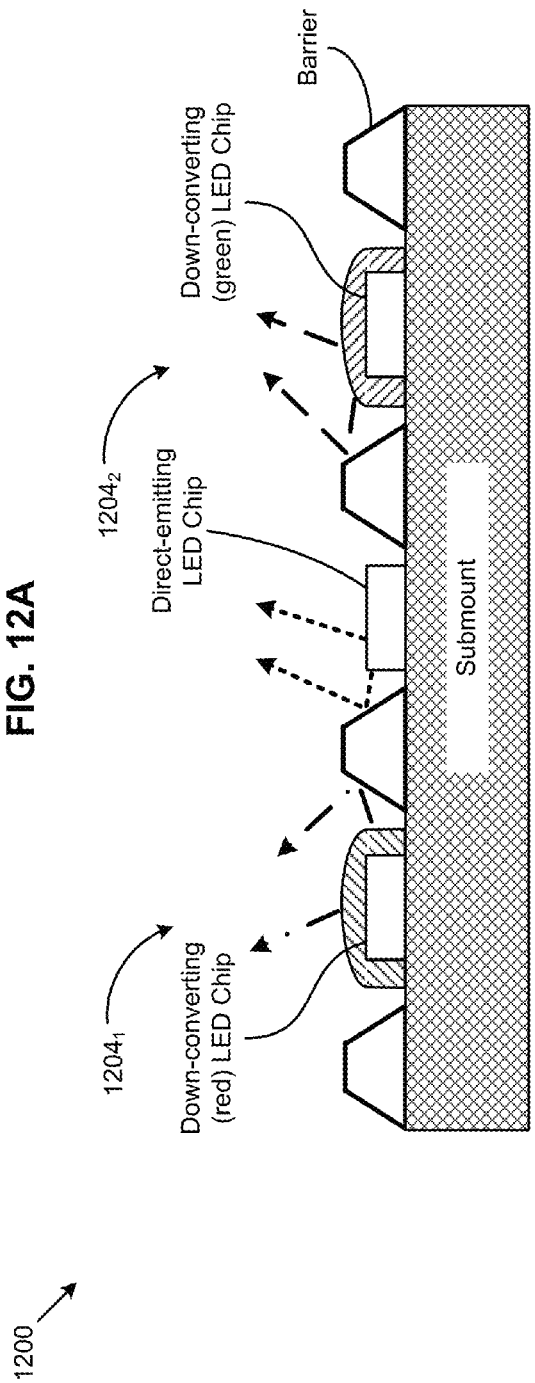

SYSTEM AND METHOD FOR PROVIDING COLOR LIGHT SOURCES IN PROXIMITY TO PREDETERMINED WAVELENGTH CONVERSION STRUCTURES

CROSS-REFERENCE TO RELATED APPLICATIONS

This application is a continuation of U.S. application Ser. No. 13/328,978, filed on Dec. 16, 2011, now allowed, which claims benefit under 35 USC §119(e) to U.S. Provisional Application No. 61/424,562, filed Dec. 17, 2010; which is a continuation-in-part to U.S. application Ser. No. 13/019,897, filed Feb. 2, 2011, which claims benefit under 35 USC §119(e) to U.S. Provisional Application No. 61/301,193, filed Feb. 3, 2010; which is a continuation-in-part to U.S. application Ser. No. 13/014,622, filed Jan. 26, 2011, which claims benefit under 35 USC §119(e) to U.S. Provisional Application No. 61/357,849, filed Jun. 23, 2010, each of which is incorporated by reference in its entirety.

BACKGROUND OF THE INVENTION

The present disclosure relates generally to light emitting devices and, more particularly, to techniques for using wavelength conversion materials with light emitting devices.

The present disclosure is directed to optical devices. The disclosure provides a light source that includes two or more layers of phosphor materials excited by radiation sources that emit radiations in two or more wavelengths, with at least one of the radiation wavelength less than 440 nm. In a specific embodiment where LED radiation sources are used, LED radiation sources that emit ultra-violet (UV), violet (V), or near-ultraviolet (NUV) radiation are used to excite blue phosphor material. In various embodiments, red and green phosphor materials are used and the LED radiation sources are arranged in a specific pattern. In other embodiments red, green, and blue phosphor materials are used.

In the late 1800's, Thomas Edison invented the light bulb. The conventional light bulb, commonly called the "Edison bulb", has been used for over one hundred years. The conventional light bulb uses a tungsten filament enclosed in a glass bulb sealed in a base, which is screwed into a socket. The socket is coupled to an AC power or DC power source. The conventional light bulb can be found commonly in houses, buildings, and outdoor lightings, and other areas requiring light. Unfortunately, drawbacks exist with the conventional Edison light bulb. That is, the conventional light bulb dissipates much thermal energy. More than 90% of the energy used for the conventional light bulb dissipates as thermal energy. Additionally, the conventional light bulb eventually fails due to evaporation of the tungsten filament.

Fluorescent lighting overcomes some of the drawbacks of the conventional light bulb. Fluorescent lighting uses an optically clear tube structure filled with a noble gas, and typically also contains mercury. A pair of electrodes is coupled between the gas and to an alternating power source through ballast to excite the mercury. Once the mercury has been excited, it discharges, emitting UV light. Typically, the optically clear tube is coated with phosphors, which are excited by the UV light to provide white light. Many building structures use fluorescent lighting and, more recently, fluorescent lighting has been fitted onto a base structure, which couples into a standard socket.

Solid state lighting techniques are also known. Solid state lighting relies upon semiconductor materials to produce light emitting diodes (LEDs). At first, red LEDs were used. Modern red LEDs use Aluminum Indium Gallium Phosphide (AlInGaP) semiconductor materials. Most recently, Shuji Nakamura pioneered the use of InGaN materials to produce LEDs emitting light in the blue color range for LEDs. The blue light LEDs led to innovations such as solid state white lighting, the blue laser diode, the Blu-Ray™ DVD player, and other developments. Blue-, violet-, or ultraviolet-emitting devices based on InGaN are used in conjunction with phosphors to provide white LEDs. Other colored LEDs have also been proposed.

One way of improving solid state light efficiency has been to use phosphor converted LEDs (pcLED) technology, where an LED emits radiation that excites phosphors, which in turn emit light. Unfortunately, conventional pcLEDs have been inadequate, especially for white light for general illumination applications. In particular, blue-excited pcLED configurations have the challenge that blue light leakage must be managed to provide a stable white output. This is difficult because blue light leakage depends on the peak emission wavelength which shifts with drive current and operating temperature. V- or NUV-excited pcLEDs avoid this problem, but have performance disadvantages due to increased Stokes' loss, as well as cascading conversion loss, since much of the V or NUV light pumps blue phosphor, which then excites green and red phosphors, rather than direct excitation of the green and red phosphors.

Therefore, it is desirable to have improved techniques for phosphor-based LED devices.

BRIEF SUMMARY OF THE INVENTION

The present disclosure is directed to optical devices. The disclosure provides a light source that includes two or more layers of phosphor materials excited by radiation sources that emit radiations in two or more wavelengths, with at least one of the radiation wavelengths less than 440 nm. In a specific embodiment where LED radiation sources are used, LED radiation sources that emit ultra-violet (UV), violet (V), or near-ultraviolet (NUV) radiation are used to excite blue phosphor material. In various embodiments, red and green phosphor materials are used and the LED radiation sources are arranged in a specific pattern. In other embodiments red, green, and blue phosphor materials are used.

In one embodiment, an optical device includes a submount having a surface. The device includes a first plurality n of radiation sources positioned on the surface configured to emit radiation characterized by a first wavelength with a range between about 380 nm to 470 nm. The device also includes a second plurality m of radiation sources positioned on the surface configured to emit radiation characterized by a second wavelength shorter than the first wavelength. The ratio between m and n is based on a selected wavelength. The device further includes a first wavelength converting layer configured to absorb at least a portion of radiation emitted by the first plurality of radiation sources and the second plurality of radiation sources. The first wavelength converting layer is associated with a wavelength emission ranging from 590 nm to 650 nm. The device includes a second wavelength converting layer configured to absorb at least a portion of radiation emitted by the first plurality of radiation sources and the second plurality of radiation sources. The second wavelength converting layer is associated with a wavelength emission ranging from 490 mn to 590 nm. The device additionally includes a third wavelength converting layer configured to absorb at least a portion of radiation emitted by the second plurality of radiation sources. The third wavelength converting layer is associated with a wavelength emission ranging from about 440 nm to about 490 nm.

In another embodiment, an optical device includes a submount having a surface. The device also includes a first plurality n of radiation sources configured to emit radiation characterized by a first wavelength with a range between about 380 nm to 470 nm. The device also includes a second plurality m of radiation sources configured to emit radiation characterized by a second wavelength shorter than the first wavelength. The second plurality of radiation sources are positioned on the surface and arranged in a specific pattern. The ratio between m and n is based on a selected wavelength. The device also includes a first wavelength converting layer associated with a wavelength emission ranging from 590 nm to 650 nm configured to absorb at least a portion of radiation emitted by the first plurality of radiation sources and the second plurality of radiation sources. The device further includes a second wavelength converting layer associated with a wavelength emission ranging from 490 mn to 590 nm configured to absorb at least a portion of radiation emitted by the first plurality of radiation sources and the second plurality of radiation sources. The device also includes a phosphor pattern associated with a wavelength emission ranging from 440 nm to 490 nm overlaying the second plurality of radiation sources configured to absorb at least a portion of radiation emitted by the second plurality of radiation sources. A further understanding of the nature and advantages of the present disclosure may be realized by reference to the latter portions of the specification and attached drawings.

BRIEF DESCRIPTION OF THE DRAWINGS

FIG. 1A is a simplified diagram illustrating a chip-array-based pcLED apparatus with an RGB phosphor mix for generating white light, according to an embodiment of the disclosure.

FIG. 2 is a simplified diagram illustrating a chip-array-based apparatus 200 having green and red wavelength converting material, according to some embodiments.

FIG. 5 is a simplified diagram illustrating an optical device according to an embodiment of the present disclosure.

FIG. 6 is a simplified diagram illustrating an optical device according to an embodiment of the present disclosure.

FIG. 12A is a simplified diagram illustrating an optical device having red, green, and blue LEDs disposed within recesses, according to an embodiment of the present disclosure.

FIG. 12B is a simplified diagram illustrating an optical device having red, green, and blue LEDs disposed between barriers, according to an embodiment of the present disclosure.

DETAILED DESCRIPTION OF THE INVENTION

Figure 1B:
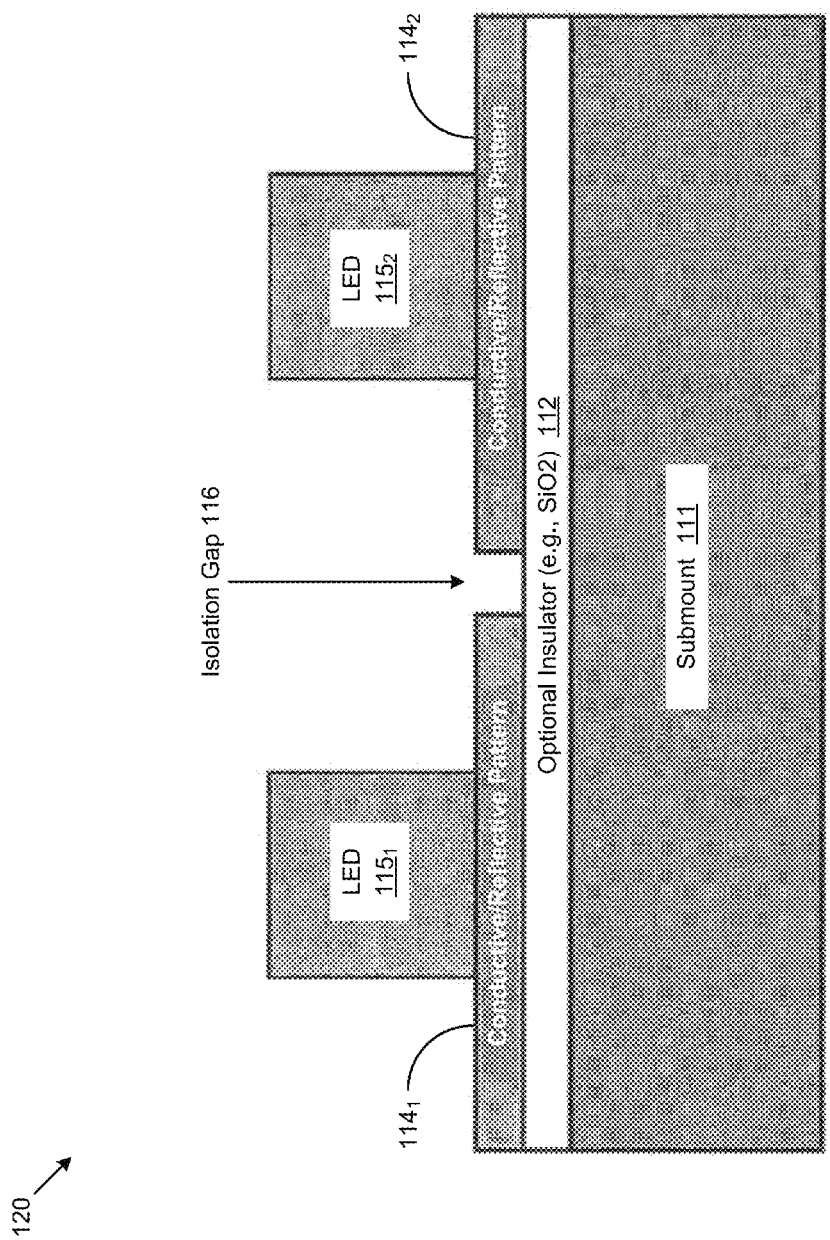
FIG. 1B is a simplified diagram illustrating construction of a radiation source comprised of light emitting diodes, according to some embodiments.

Various types of phosphor-converted (pc) light-emitting diodes (LEDs) have been proposed in the past. Conventional pcLEDs include a blue LED with a yellow phosphor. UV or V-based phosphor-converted (pc) LEDs exhibit certain advantages in performance (compared to blue-pumped pcLEDs) such as high color rendering (broadband spectrum comprising phosphor emission) and accurate color control (e.g., as the violet "pump" light contributes little to the chromaticity).

FIG. 1A is a simplified diagram illustrating a chip-array-based pcLED apparatus with an RGB phosphor mix for generating white light. As shown in FIG. 1A, the pcLED apparatus 100 includes three layers of phosphor materials: blue phosphor material 104, red phosphor material 103, and green phosphor material 102. The phosphor materials are excited by radiations emitted by LED devices (e.g., LED device 101). As an example, the LED devices are each nominally monochromatic and emit in a similar wavelength range.

FIG. 1B is a simplified diagram illustrating construction of a radiation source comprised of light emitting diodes. As shown, the radiation source 120 constructed on a submount 111 upon which submount is a layer of sapphire or other insulator 112, upon which, further, are disposed one or more conductive contacts (e.g., conductive contact $114_1$, conductive contact $114_2$), arranged in an array where each conductive contact is spatially separated from any other conductive contact by an isolation gap 116. FIG. 1B shows two conductive contacts in a linear array, however other arrays are possible, and are described herein. Atop the conductive contacts are LED devices (e.g., LED device $115_1$, LED device $115_2$, LED device $115_N$, etc.). The LED device is but one possibility for a radiation source, and other radiation sources are possible and envisioned, for example a radiation source can be a laser device.

In a specific embodiment, the devices and packages disclosed herein include at least one non-polar or at least one semi-polar radiation source (e.g. an LED or laser) disposed on a submount. The starting materials can comprise polar gallium nitride containing materials.

The radiation source 120 is not to be construed as conforming to a specific drawing scale, and in particular, many structural details are not included in FIG. 1B so as not to obscure understanding of the embodiments. In particular, the dimensions of the isolation gap of FIG. 1B serves to separate the conductive contacts (e.g., conductive contact $114_1$, conductive contact $114_2$) one from another, and in some embodiments, the isolation is relatively wider, or deeper, or shorter or shallower. The isolation gap serves to facilitate shaping of materials formed in and around the isolation gap, which formation can be by one or more additive processes, or by one or more subtractive processes, or both. The aforementioned shaped materials serve as an isolation barrier. Further details are presented infra.

It is to be appreciated that the radiation sources illustrated in FIG. 1B can output light in a variety of wavelengths (e.g., colors) according to various embodiments of the present disclosure. Depending on the application, color balance can be achieved by modifying color generated by LED devices using a wavelength-modifying material (e.g., a phosphor material). In one embodiment, the phosphor material may be mixed with encapsulating material (e.g., silicone material) that distributes phosphor color pixels within a thin layer atop the array of LED devices. Other embodiments for providing color pixels can be conveniently constructed using a cover member (see FIG. 1C) that comprises deposits of one or more wavelength-modifying materials.

Figure 1C:
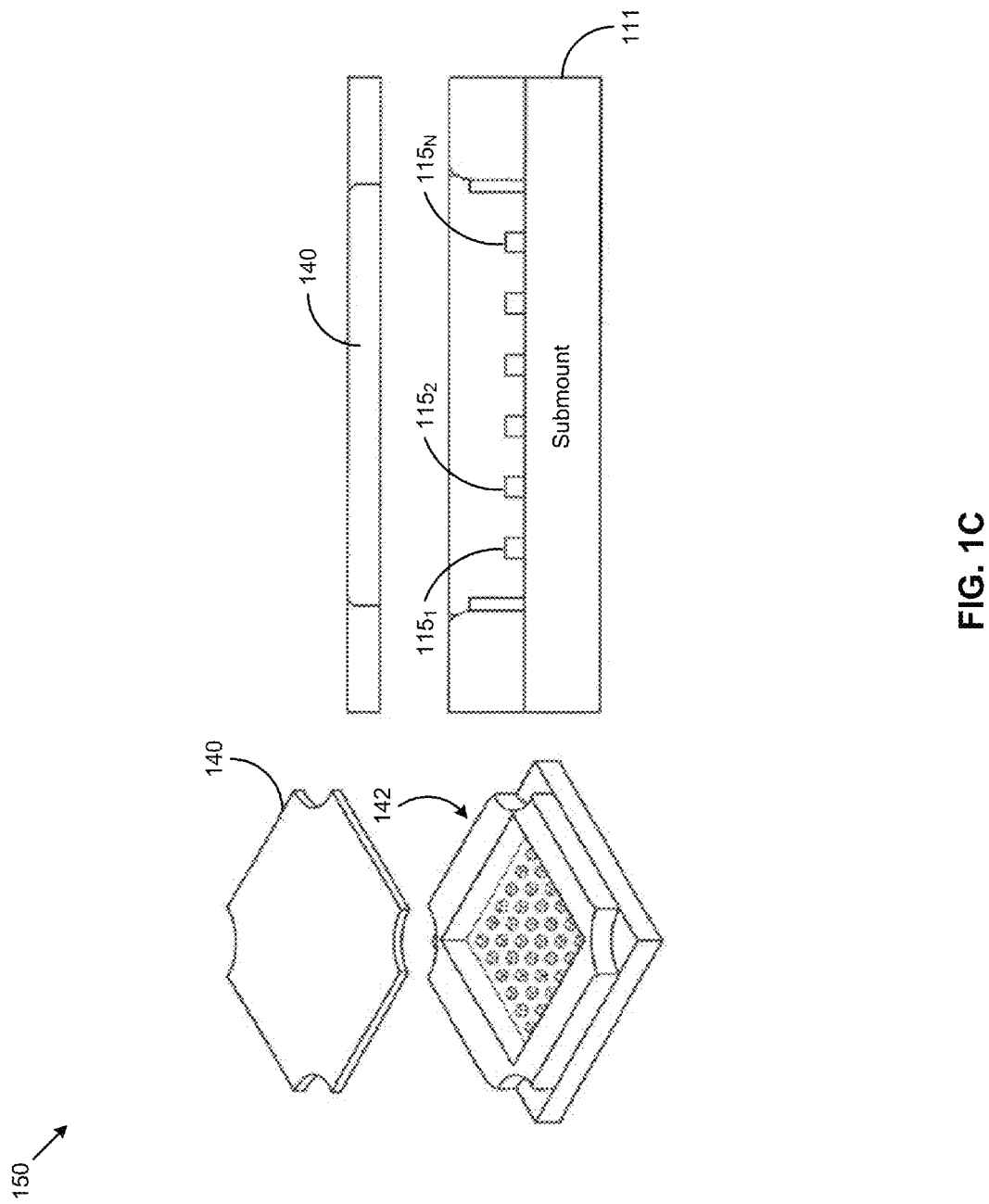
FIG. 1C is a simplified diagram illustrating an optical device embodied as a light source constructed using an array of LEDs juxtaposed with a cover member, according to some embodiments.

FIG. 1C is a simplified diagram illustrating an optical device 150 embodied as a light source 142 constructed using an array of LEDs juxtaposed with a cover member 140, the cover member having a mixture of wavelength converting materials distributed within the volume of the cover member, according to some embodiments. The wavelength converting materials can be distributed in a variety of configurations. For example, the light source 142 can include blue color emitting material at its corners, green color emitting material at its edges, and red color emitting material at its center. Individually, and together, these color pixels modify the color of light emitted by the LED devices. For example, the color pixels are used to modify the light from LED devices to appear as white light having a uniform broadband emission (e.g., characterized by a substantially flat emission of light throughout the range of about 380 nm to about 780 nm), which is suitable for general lighting. In one embodiment, "blank" pixels are used for later color tuning and the color of the light from LED devices is measured.

In various embodiments, color balance adjustment is accomplished by using pure color pixels, mixing phosphor material, and/or using a uniform layer of phosphor over LED devices. In one embodiment, color balance tuning is achieved by providing a color pattern on a cover member 140. Or, the cover member can be is made of glass material and function as a 405 nm reflection dichroic lens. Hermetic sealing techniques may be used to encapsulate the cover member within the optical device 150. A color tuning using cover member can also be achieved through light absorption and/or light reflection.

In one embodiment, a predeposited phosphor plate is attached to the cover member based on a predetermined pattern. For example, after positioning wavelength-modifying material in the vicinity of the light emitting devices, the color of the aggregate emitted light by the optical device 150 is measured. Based on the measured color, the positioning of the wavelength-modifying material is determined and used to balance the color of the aggregate emitted light. Various wavelength converting processes are discussed infra.

In an alternative embodiment, wavelength converting processes are facilitated by using one or more pixilated phosphor plates that are attached to the cover member. For example, the pixilated phosphor plates include color and, depending on the application, color patterns of the phosphor plate may be predetermined based on the measured color balance of the aggregate emitted light. In an alternative embodiment, the absorption plate, which is attached to the cover member, is used to perform color correction. In some situations, the absorption plate comprises color absorption material. For example, the absorbing and/or reflective material can be plastic, ink, die, glue, epoxy, and others.

In other embodiments, the phosphor particles are embedded in a reflective matrix (e.g., the matrix formed by conductive contacts). Such phosphor particles can be disposed on the substrate by deposition. In one specific embodiment, the reflective matrix comprises silver or other suitable material. Alternatively, one or more colored pixilated reflector plates (not shown) are attached to the cover member to adjust color balance of the LED devices. In some situations, materials such as aluminum, gold, platinum, chromium, and/or others are deposited on the pixilated reflector plates to provide color balance.

Figure 1D:
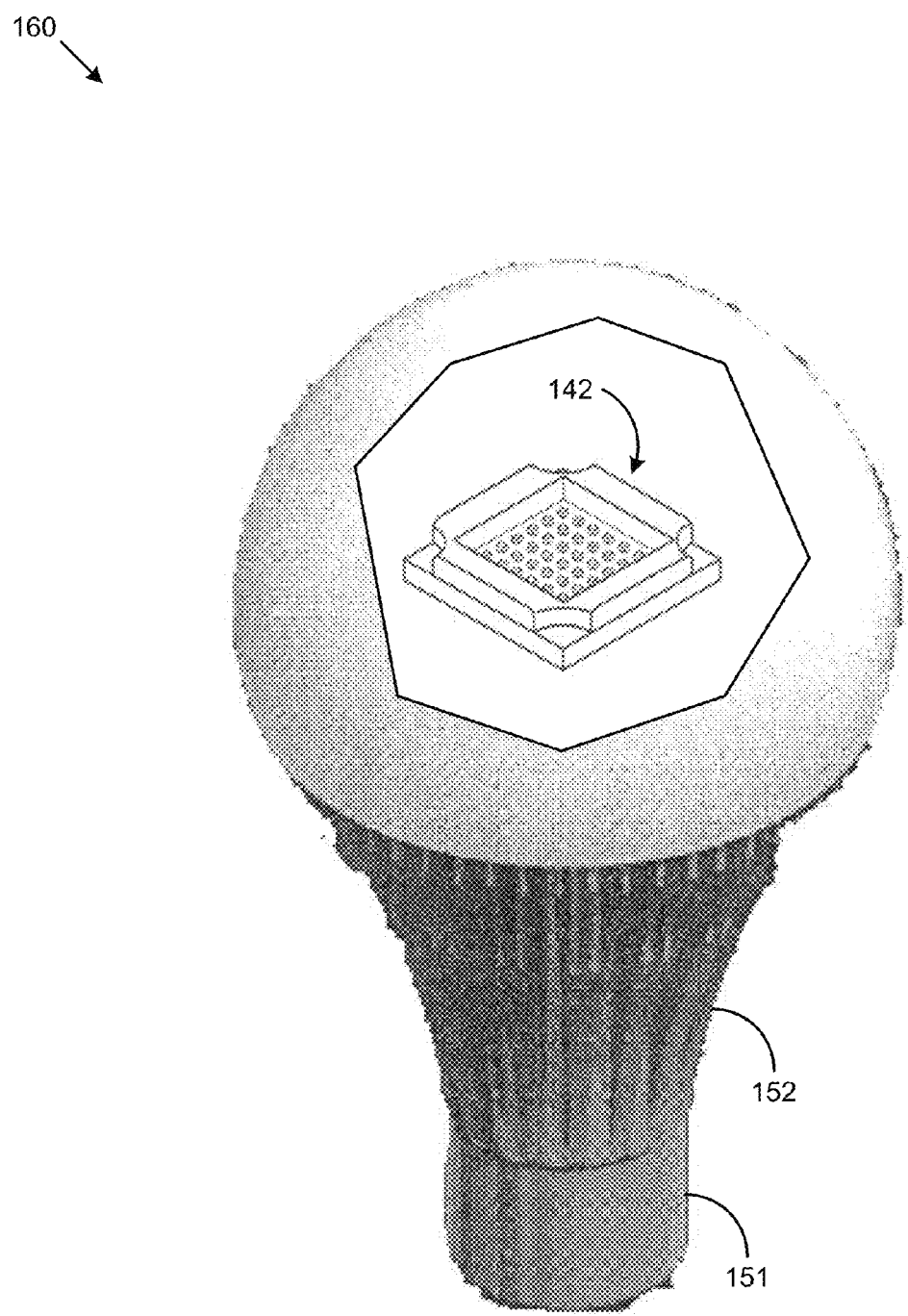
FIG. 1D is a simplified diagram illustrating an LED lamp having a base to provide a mount point for a light source, according to some embodiments.

FIG. 1D is a simplified diagram illustrating an LED lamp 160 having a base to provide a mount point for a light source, according to some embodiments. It is to be appreciated that an LED lamp 160, according to the present disclosure, can be implemented for various types of applications. As shown in FIG. 1D, a light source (e.g., the light source 142) is a part of the LED lamp 160. The LED lamp 160 includes a base member 151. The base member 151 is mechanically connected to a heat sink 152. In one embodiment, the base member 151 is compatible with conventional light bulb socket and is used to provide electrical power (e.g., using an AC power source) to the one or more radiation emitting devices (e.g., one or more instances of light source 142).

FIG. 2 is a simplified diagram illustrating a chip-array-based apparatus 200 having green and red wavelength converting material. Compared to the device shown in FIG. 1A, only two layers of wavelength converting materials are used. This example shows a transparent (non-converting layer) as well as a layer of green wavelength converting materials 202 and a layer of red wavelength converting materials 204. The LED devices (e.g., LED device 201) comprising the array are blue-emitting. The combination of blue LED light emission and the green and red wavelength converting materials emission results in white light.

Figure 3A:
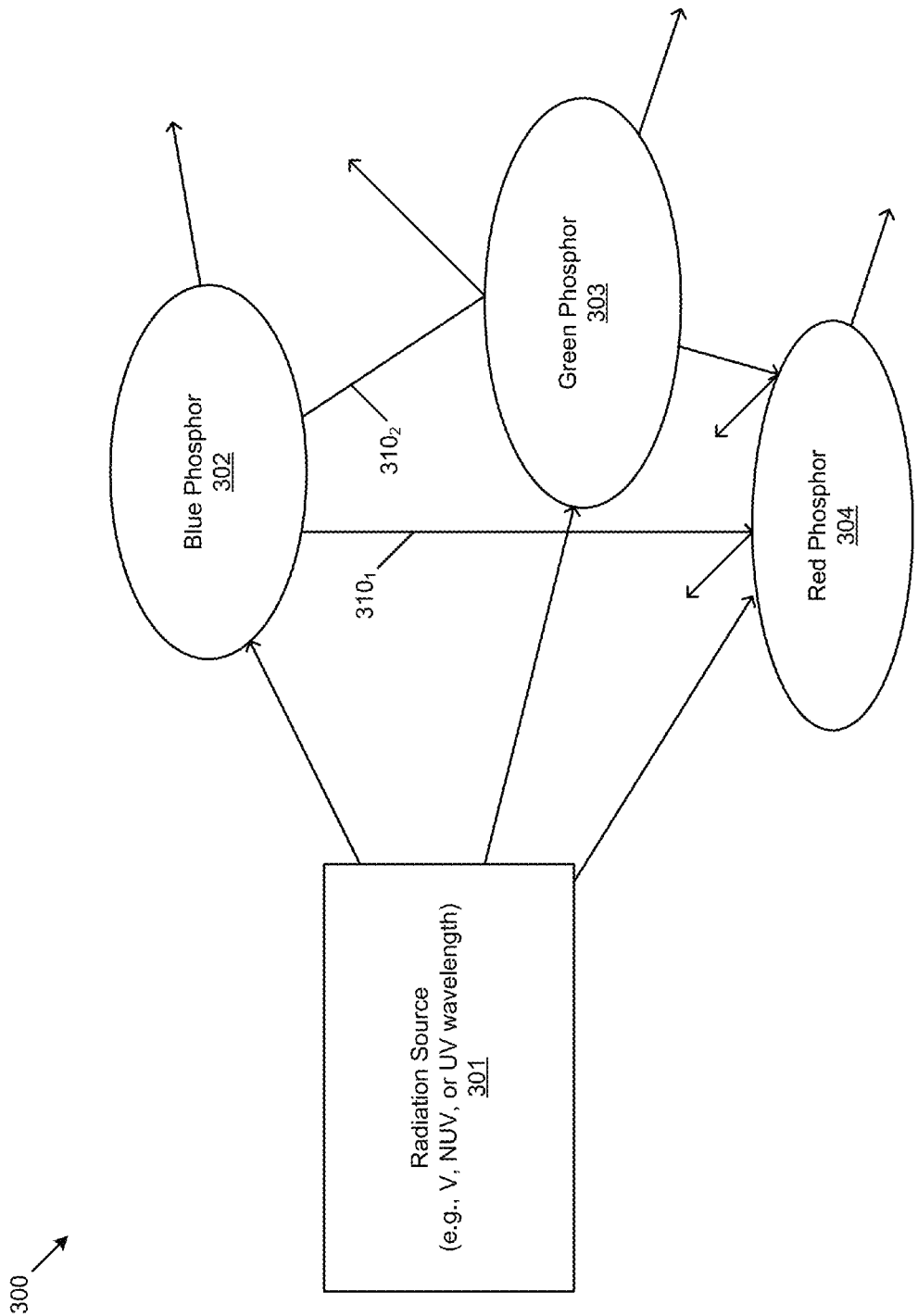
FIG. 3A is a simplified diagram illustrating a conversion process, according to some embodiments.

FIG. 3A is a simplified diagram illustrating a conversion process 300. As shown, a radiation source 301 is configured to emit radiation at violet, near ultraviolet, or UV wavelengths. The radiation emitted by radiation source 301 is absorbed by the phosphor materials (e.g., the blue phosphor material 302, the green phosphor material 303, and the red phosphor material 304). Upon absorbing the radiation, the blue phosphor material 302 emits blue light, the green phosphor material 303 emits green light, and the red phosphor material 304 emits red light. As shown, a portion (e.g., portion $310_1$, portion $310_2$) of the emissions from the blue phosphor are incident on the surrounding phosphors, and are absorbed by the green phosphor material and red phosphor material, which emits green and red light, respectively. This particular process of converted blue light being further absorbed and converted (e.g., in a cascade of emission and absorption) is considered a lossy process, and in some cases can be undesirable.

Figure 3B:
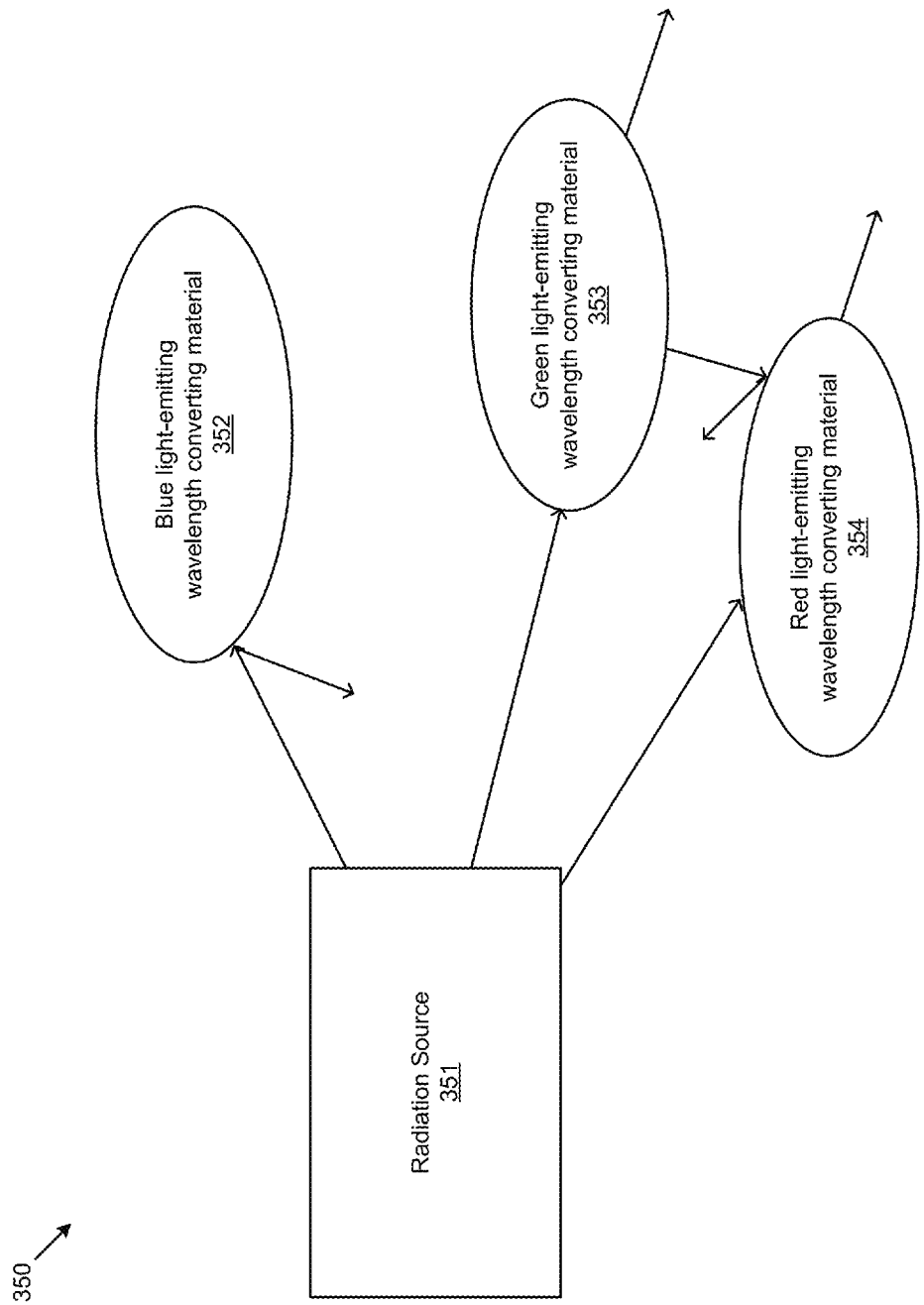
FIG. 3B is a simplified diagram illustrating a conversion process, according to some embodiments.

FIG. 3B is a simplified diagram illustrating a conversion process 350. As shown, a radiation source 351 is configured to emit radiation at a wavelength that is substantially in the blue spectrum. The radiation emitted by radiation source 351 is reflected by blue light emitting wavelength converting material 352 and absorbed by the green light emitting wavelength converting material 353 and red light emitting wavelength converting material 354. Upon absorbing the radiation, green light emitting wavelength converting material 353 emits green light, and the red light emitting wavelength converting material 354 emits red light. A portion of the converted blue light is absorbed by the green light emitting wavelength converting material and red light emitting wavelength converting material, which emits green and red light, respectively. This particular process of converted blue light being further absorbed and converted is considered a lossy process, and in some cases can be undesirable.

Figure 4:
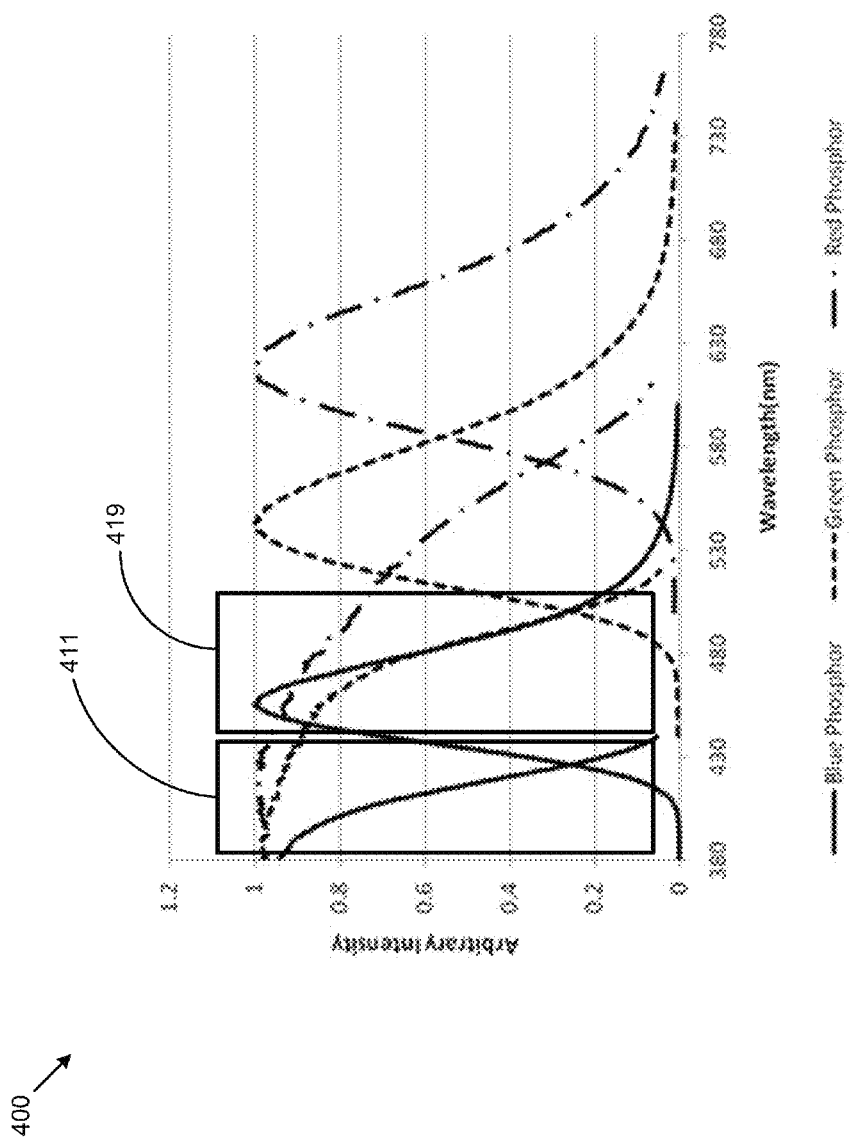
FIG. 4 is a graph illustrating a light process chart by phosphor material, according to some embodiments.

FIG. 4 is a graph illustrating a light process chart 400 by phosphor material. As shown in FIG. 4, radiation with a wavelength of violet, near violet, or ultraviolet from a radiation source is absorbed by the blue phosphor material, which in turn emits blue light. However, since the blue color light can also be absorbed by red and green phosphor, a portion of the blue light is converted to green or red light. As shown in FIG. 4, each phosphor is most effective at converting radiation at its particular range of wavelength. And, as shown, some of these ranges overlap. In particular, the wavelength range from about 380 nm to about 430 nm (shown as wavelength range 411) exhibits absorption by all three phosphors (e.g., blue, green, and red). However, the wavelength range from about 430 nm to about 500 nm (shown as wavelength range 419) exhibits absorption by substantially only two phosphors (e.g., green, and red). Thus, the effect of the lossy conversion processes (e.g., conversion process 300 and conversion process 350) in absorbing blue light from the radiation sources, and re-absorbing blue-emitted light from the wavelength converting materials, is reduced.

Yet, it remains a challenge with UV- or V-pumped embodiments (e.g., pcLEDs) where there remains a requirement for a short pump wavelength to excite a blue phosphor while reducing the lossy effects as heretofore described. Among other challenges, the short wavelength light is susceptible to optical loss in materials typically employed in the fabrication of LEDs including GaN semiconductor material, packaging material, contacts and metallization (especially Ag) material, and encapsulation material (e.g., silicone or epoxy). Furthermore, short wavelength LEDs that pump a blue phosphor may generate blue photons which subsequently pump lower-energy phosphors (e.g., green and red), as illustrated in FIG. 4. This cascading event is lossy, according to the quantum efficiency of the blue phosphor, thereby reducing color conversion efficiency. It is thus desirable to maintain the benefits of UV- and/or V-based LEDs while maintaining high conversion efficiency.

It is to be appreciated that embodiments of the present disclosure maintain the benefits of UV- and/or V-pumped pcLEDs while improving conversion efficiency. In one embodiment, an array of LED chips is provided, and is comprised of two groups. One group of LEDs has a shorter wavelength to enable pumping of a blue phosphor material. The second group of LEDs has a longer wavelength which may, or may not, excite a blue phosphor material, but will excite a green or longer wavelength (e.g., red) phosphor material. For example, the first group of LEDs might have an average emission wavelength of less than 405 nm, while the second group may have an average emission wavelength greater than 405 nm. The combined effect of the two groups of LEDs in the array is to provide light of desired characteristics such as color (e.g., white) and color rendering. Furthermore, the conversion efficiency achieved in the preferred embodiment will be higher than that of the conventional approach. In particular, the cascading loss of blue photons pumping longer-wavelength phosphors may be reduced by localizing blue phosphor to regions near the short-wavelength LEDs. In addition, the longer-wavelength pump LEDs will contribute to overall higher efficacy by being less susceptible to optical loss mechanisms in GaN, metallization, and packaging materials, as described above.

FIG. 5 is a simplified diagram illustrating an optical device, according to an embodiment of the present disclosure. As shown in FIG. 5, an optical device 500 includes a submount 111 (not shown) that has a surface. A number of radiation sources are provided on the submount. According to various embodiments, two types of radiation sources are provided, and each type of radiation source is associated with a range of wavelength. For example, radiation sources include a first plurality of radiation sources that are configure to emit radiation characterized by a first wavelength. More specifically, the first wavelength can have a range of between about 380 nm to 470 nm. In a specific embodiment, the first wavelength is characterized by a peak emission of about 420 nm to 470 nm. The first plurality of radiation sources is positioned on the surface, and the first plurality of radiation sources comprising n number of radiation sources. For example, the first plurality of radiation sources includes "long" violet LED devices 501 and 506.

The radiation sources also include a second plurality of radiation sources that are configured to emit radiation characterized by a second wavelength. In exemplary embodiments, the second wavelength is shorter than the first wavelength. More specifically, the second wavelength is violet or ultraviolet. In a specific embodiment, the second plurality of radiation sources is characterized by a peak emission in the range of about 380 nm to about 430 nm. In a certain embodiment, the second wavelength is less than 390 nm. The second plurality of radiation sources is positioned on the surface of the submount. The second plurality of radiation sources includes m number of radiation sources. The ratio between the number m and the number n is predetermined based on a selected wavelength. Typically, for warm color temperatures, n is greater than m. The ratio of n to m can be 1:1, 2:1, 10:1, and other ratios. For example, the ratio can be based on a selected wavelength output for the optical device 500. As an example, the second plurality of radiation sources comprises LED devices 505 and 507.

Depending on the application, the arrangement of a first plurality and a second plurality of radiation sources can be based on various criteria. For example, particular patterns can be used to maximize the efficiency of the optical device 500.

The optical device 500 includes three wavelength converting layers overlaying the radiation sources: a first wavelength converting layer 503, a second wavelength converting layer 502, and a third wavelength converting layer 504. The first wavelength converting layer 503 is configured to absorb at least a portion of radiation emitted by both the first plurality of radiation sources and the second plurality of radiation sources. More specifically, the first wavelength converting layer is associated with a wavelength emission ranging from 590 nm to 650 nm. For example, the first wavelength converting layer comprises red phosphor material that is adapted to emit substantially red color light.

The second wavelength converting layer 502 is configured to absorb at least a portion of radiation emitted by the first plurality of radiation sources and the second plurality of radiation sources. The second wavelength converting layer is associated with a wavelength emission ranging from 490 nm to 590 nm. For example, the second wavelength converting layer comprises a green phosphor that is adapted to emit substantially green light.

The third wavelength converting layer 504 is configured to absorb at least a portion of radiation emitted by the second plurality of radiation sources. The third wavelength converting layer is associated with a wavelength emission ranging from 440 nm to 490 nm. For example, the third wavelength converting layer comprises a blue phosphor material that is adapted to emit substantially blue light.

Depending on the application, the optical device 500 may include other components as well. In certain embodiments, the optical device 500 includes a power source that is capable of selectively powering the radiation sources or LED devices. In a specific embodiment, the power source is configured to turn radiation sources on and off based on the desired color output. For example, by selectively turning off the radiation source of a specific wavelength, the color output of the optical device is changed. More particularly, a driving circuit can be configured to selectively power the first plurality of radiation devices while maintaining a constant power to the second plurality of radiation sources. Or, the driving circuit can be configured to tune to a ratio of energy being delivered to the first plurality of radiation sources as compared to energy delivered to the second plurality of radiation sources.

In certain embodiments, the power source is configured to turn off certain radiation sources for dimming purposes. The optical device 500 can also include other components such as a housing member, sealing material, transparent cover, encapsulating material, and others. And, in certain embodiments, patterned phosphor materials are used.

FIG. 6 is a simplified diagram illustrating an optical device 600, according to an embodiment of the present disclosure. As shown in FIG. 6, an optical device 600 includes a submount 111 (not shown) that has a surface. A number of radiation sources are provided on the submount. According to various embodiments, two types of radiation sources are provided, and each type of radiation source is associated with a range of wavelength. For example, radiation sources include a first plurality of radiation sources that are configured to emit radiation characterized by a first wavelength. More specifically, the first wavelength can have a range of between about 380 nm to 470 nm. In a specific embodiment, the first wavelength is characterized by a peak emission at about 420 nm to 470 nm. The first plurality of radiation sources are positioned on the surface. The first plurality of radiation sources have an n number of radiation sources. For example, the first plurality of radiation sources includes LED devices 604 and 605.

The radiation sources of optical device 600 also include a second plurality of radiation sources that are configured to emit radiation characterized by a second wavelength. In various embodiments, the second wavelength is shorter than the first wavelength. More specifically, the second wavelength is violet or ultraviolet. In a specific embodiment, the second plurality of radiation sources are characterized by a peak emission in the range of about 380 nm to about 430 nm. In certain embodiments, the second wavelength is less than 390 nm. The second plurality of radiation sources is positioned on the surface of the submount. The second plurality of radiation sources comprises m number of radiation sources. The ratio between m and n is predetermined based on a selected wavelength. Typically, n is greater than m. The ratio of n to m can be 1:1, 2:1, 10:1, and other ratios. For example, the ratio is based on a selected wavelength output for the optical device 500. As an example, the second plurality of radiation sources comprises short violet LED devices 603 and 606.

In various embodiments, the arrangement of the radiation sources is patterned. More specifically, the locations of the second plurality of radiation sources are predetermined and are covered and/or surrounded by a specific phosphor pattern (e.g., phosphor pattern $607_1$, phosphor pattern $607_1$). The phosphor pattern is configured to be proximal to instances from among the second plurality of radiation sources. More specifically, the phosphor pattern is more remote from the first plurality of radiation sources. The phosphor pattern is configured to absorb at least a portion of radiation emitted by the second plurality of radiation sources. In various embodiments, the phosphor pattern is associated with a wavelength emission ranging from about 440 nm to about 490 nm. In a specific embodiment, the phosphor pattern comprises blue phosphor material. For example, the patterned blue phosphor material is used to convert violet or ultraviolet radiation to blue light. Among other things, the blue light converted by the patterned phosphor material can help create desired color balance and improve efficiency.

As shown, the optical device 600 also includes a first wavelength converting layer 601 configured to absorb at least a portion of radiation emitted by the first plurality of radiation sources and the second plurality of radiation sources. The first wavelength converting layer is associated with a wavelength emission ranging from 590 nm to 650 nm. For example, the first wavelength converting layer comprises red phosphor material that is adapted to emit substantially red color light.

The second wavelength converting layers 601 and 602 are configured to absorb at least a portion of radiation emitted by the first plurality of radiation sources and the second plurality of radiation sources. The second wavelength converting layer is associated with a wavelength emission ranging from 490 mn to 590 nm. For example, the second wavelength converting layer comprises a green phosphor that is adapted to emit substantially green light.

As an example, the first and second wavelength converting layer can absorb radiation from both the first plurality and second plurality of radiation sources. Additionally, the first and second wavelength converting layers may also absorb emission from the phosphor pattern. It is to be appreciated that the embodiments of the present disclosure can provide efficiency gains over conventional techniques.

Figure 7:
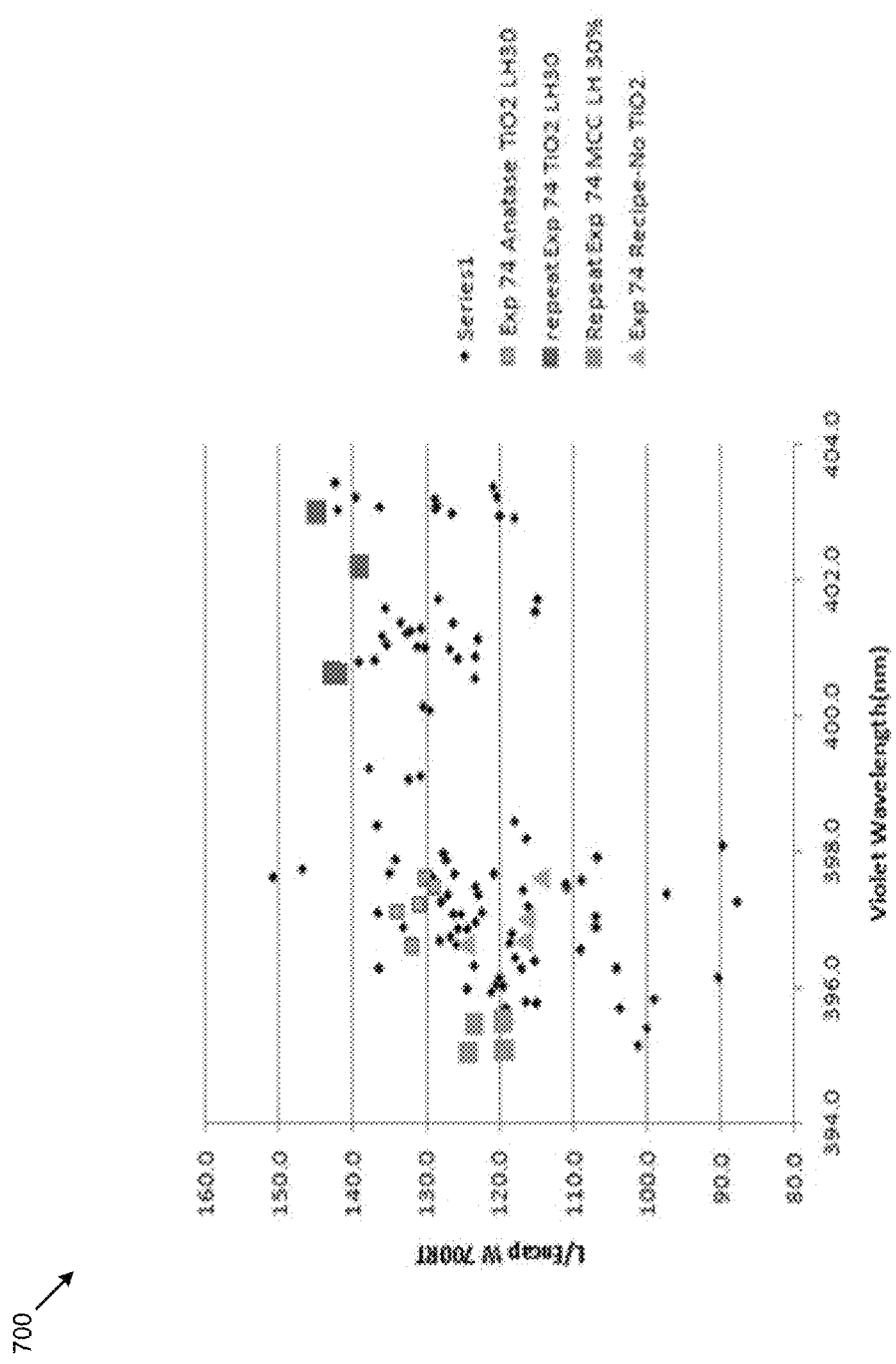
FIG. 7 is a simplified graph illustrating performance of various embodiments of optical devices, according to embodiments of the present disclosure.

FIG. 7 is a simplified graph 700 illustrating performance of various embodiments of the optical devices described herein.

It is to be appreciated that the improvement in efficiency can be dramatic. The data shown in FIG. 7 indicates a +20% gain in conversion efficiency by pumping a tri-color phosphor mix with 405 nm radiating LEDs vs. 395 nm LEDs. In this comparison, the blue phosphor material is likely to be equally excited by both 395 nm and 405 nm LEDs, meaning the cascading loss of blue photons pumping green and/or red phosphors is still present. So, even higher gains are expected in cases for which a second group of LEDs is of a sufficiently long wavelength to not substantially pump the blue phosphor material.

Figure 8:
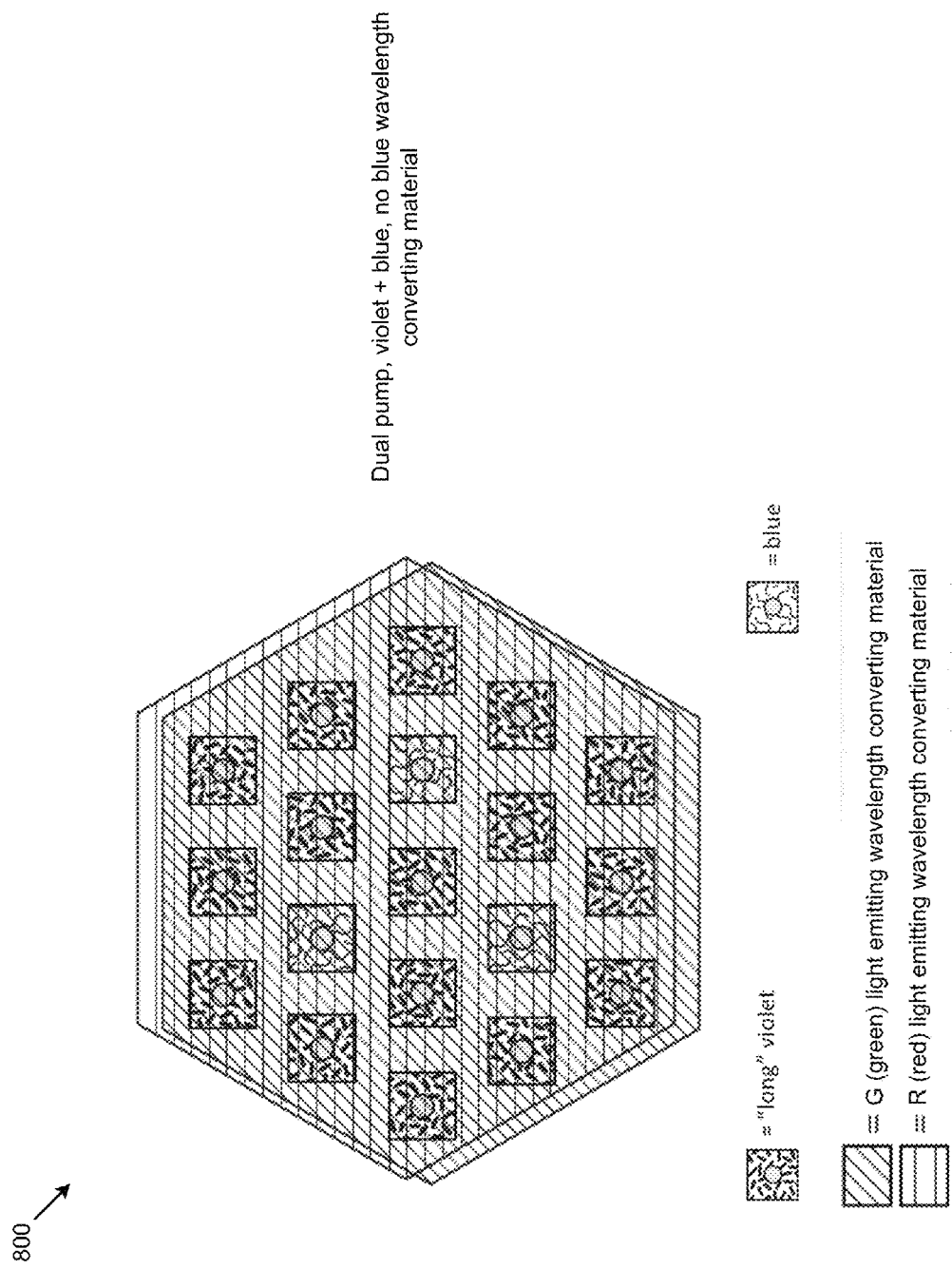
FIG. 8 is a simplified diagram illustrating an optical device having violet and blue LEDs according to an embodiment of the present disclosure.

FIG. 8 is a simplified diagram illustrating an optical device 800 having violet and blue LEDs according to an embodiment of the present disclosure. As shown in FIG. 8, violet LEDs and blue LEDs are arranged according to a predetermined pattern. In this configuration, green emitting and red emitting wavelength converting materials are used to convert radiation emitted by violet and blue LEDs. For example, the blue LEDs as shown are configured to provide blue color light, and as a result blue phosphor material is not needed for the optical system to produce white light.

One exemplary embodiment in accordance with the depiction of FIG. 8 comprises an optical device 800 comprising a submount having a surface, upon which surface is disposed a first plurality of radiation sources configured to emit radiation characterized by a first wavelength, the first wavelength having a range of about 440 nm to about 500 nm (e.g., radiating blue light), the first plurality of radiation sources being positioned on the surface, and the first plurality of radiation sources having n number of radiation sources. A second plurality of radiation sources configured to emit radiation is characterized by a second wavelength, the second wavelength being shorter than the first wavelength (e.g., radiating violet light), the second plurality of radiation source being positioned on the surface, and the second plurality of radiation sources having m number of radiation sources, where a ratio between m and n is predetermined based on a selected wavelength. Further, this embodiment comprises two layers of wavelength converting material, namely a first wavelength converting layer configured to absorb at least a portion of radiation emitted by the second plurality of radiation sources, the first wavelength converting layer having a wavelength emission ranging from about 590 nm to about 650 nm (e.g., red emissions), and a second wavelength converting layer configured to absorb at least a portion of radiation emitted by the second plurality of radiation sources, the second wavelength converting layer having a wavelength emission ranging from about 490 mn to about 590 nm (e.g., green emissions).

Figure 9:
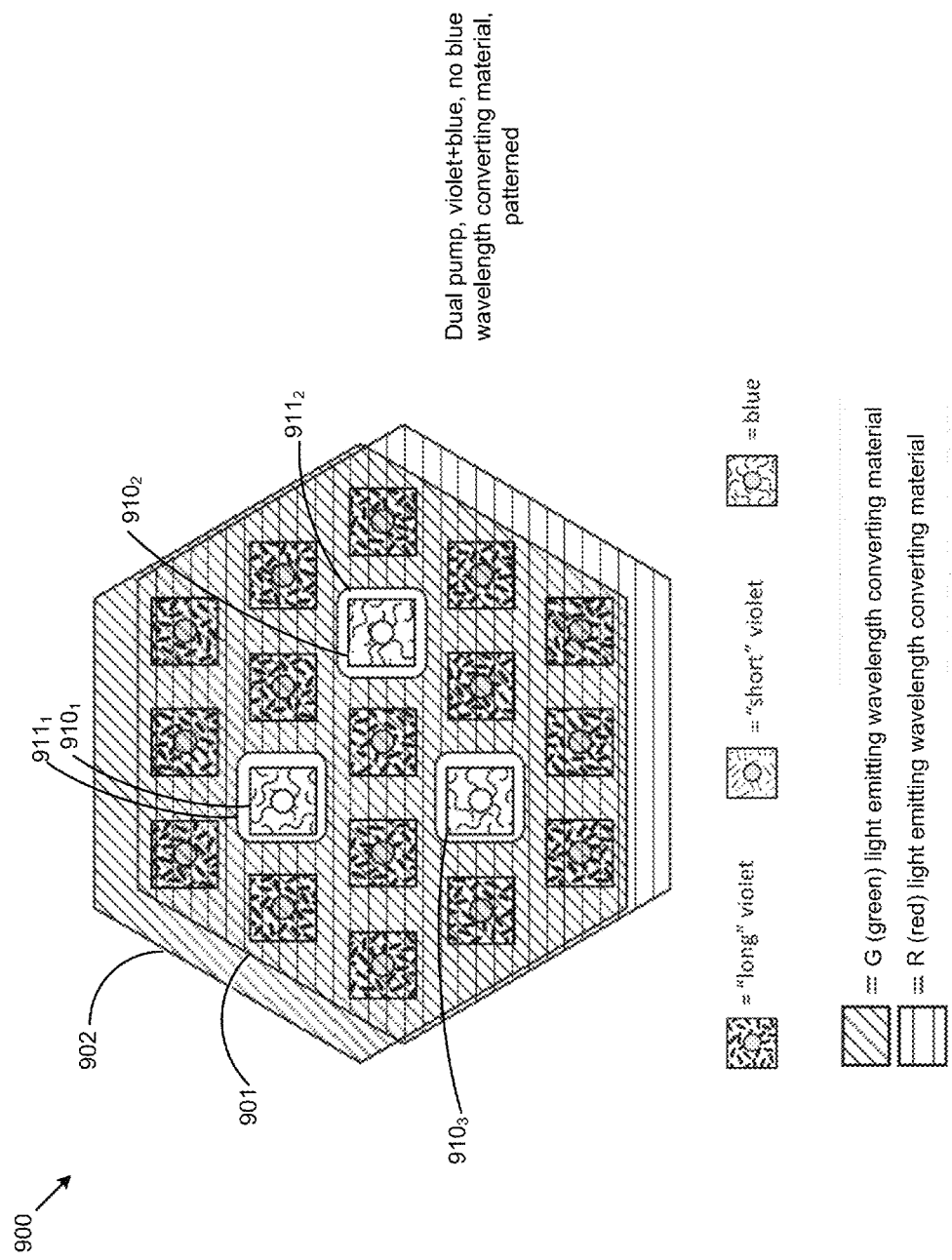
FIG. 9 is a simplified diagram illustrating an optical device having violet and patterned blue LEDs according to an embodiment of the present disclosure.

FIG. 9 is a simplified diagram illustrating an optical device 900 having violet and patterned blue LEDs according to an embodiment of the present disclosure. As shown in FIG. 9, violet LEDs and blue LEDs are arranged according to a predetermined pattern. For example, violet LEDs are characterized by a wavelength emission ranging from about 380 nm to about 430 nm, and the blue LEDs are characterized by a wavelength of about 420 nm to 490 nm. In this configuration, green phosphor materials 902 and red phosphor materials 901 are used to convert radiation emitted by violet and blue LEDs. Moreover, the blue LEDs as shown are configured to provide blue color light, and as a result blue phosphor material is not needed for the optical system to produce white light. For example, the blue LEDs are provided at predetermined locations (e.g., predetermined location $910_1$, predetermined location $910_2$, and predetermined location $910_3$) that are substantially remote from green and red phosphor material, which allows the blue LEDs to efficiently emit blue colored light that contributes to white light output. In some embodiments, the blue LEDs are provided at predetermined locations that are substantially surrounded by isolation barriers (e.g., isolation barrier $911_1$, isolation barrier $911_2$) such that the blue LEDs emit blue colored light that does not substantially interact with the green- and red-emitting wavelength converting materials.

Figure 10:
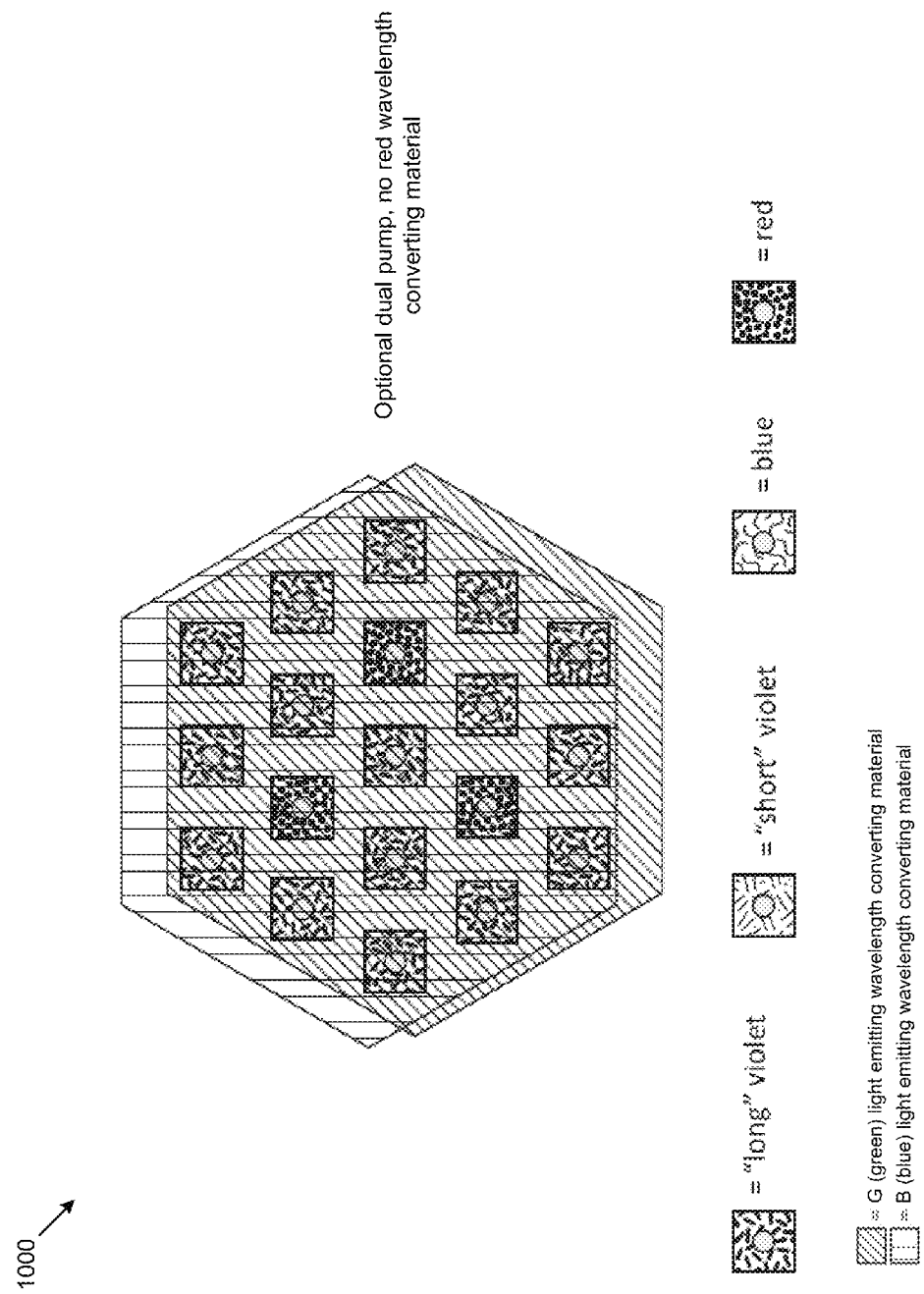
FIG. 10 is a simplified diagram illustrating an optical device having violet and red LEDs according to an embodiment of the present disclosure.

FIG. 10 is a simplified diagram illustrating an optical device 1000 having violet and red LEDs according to an embodiment of the present disclosure. As shown in FIG. 10, violet LEDs and red LEDs are arranged according to a predetermined pattern. For example, violet LEDs are characterized by a wavelength emission ranging from about 380 nm to about 430 nm, and the red LEDs are characterized by a wavelength of about 590 nm to 650 nm. In this configuration, green and blue phosphor materials are used to convert radiation emitted by violet and red LEDs. For example, the red LEDs as shown are configured to provide red color light, and as a result red phosphor material is not needed for the optical system to produce white light. For example, red light combines with blue and green light from blue and green phosphor material to form white light.

Figure 11:
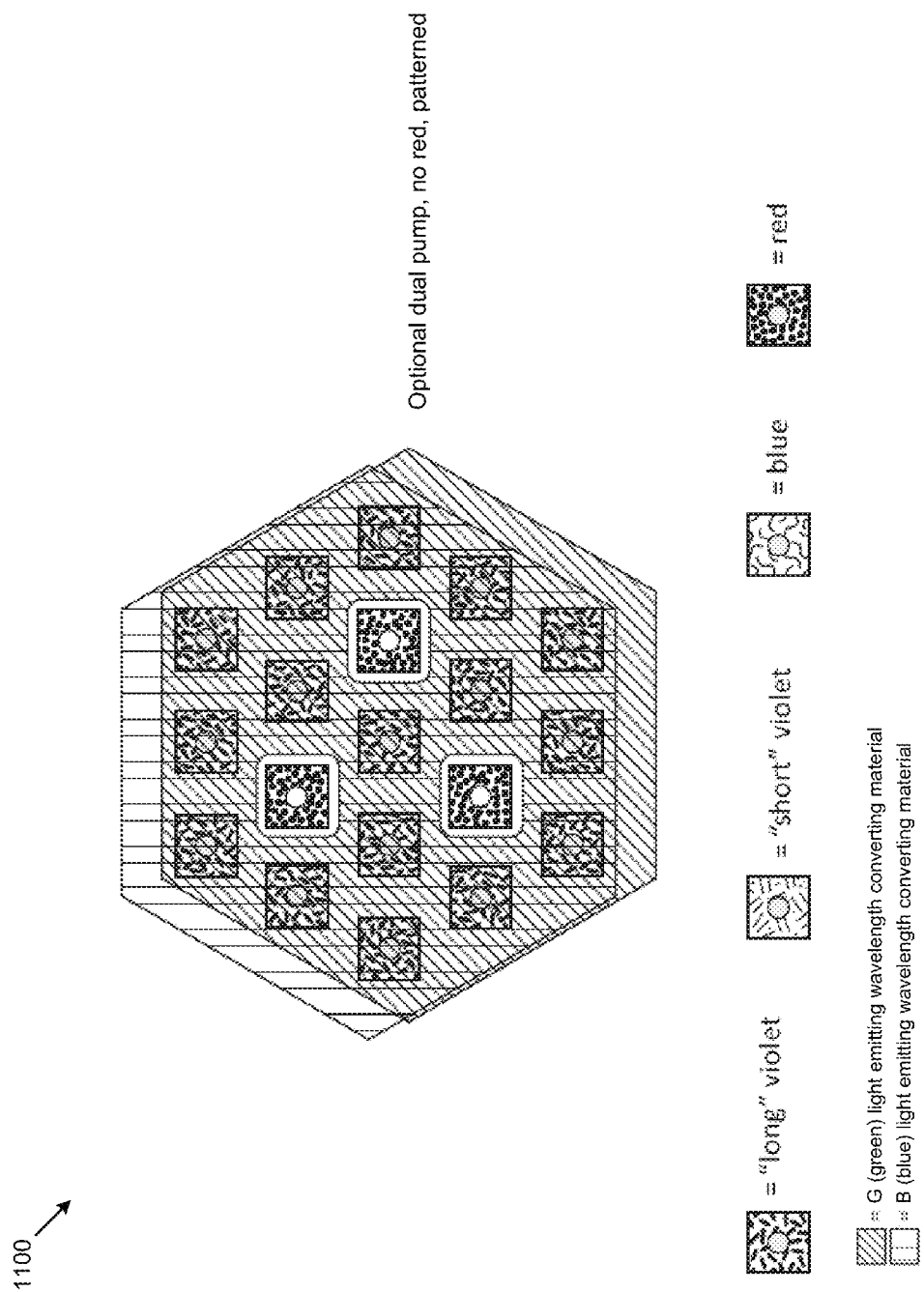
FIG. 11 is a simplified diagram illustrating an optical device having violet and red LEDs according to an embodiment of the present disclosure.

FIG. 11 is a simplified diagram illustrating an optical device 1100 having violet and red LEDs according to an embodiment of the present disclosure. As shown in FIG. 11, violet LEDs and red LEDs are arranged according to a predetermined pattern. For example, violet LEDs are characterized by a wavelength emission ranging from 380 nm to 430 nm, and the red LEDs are characterized by a wavelength of about 590 nm to 650 nm. In this configuration, green and blue phosphor materials are used to convert radiation emitted by violet and red LEDs. For example, the red LEDs as shown are configured to provide red color light, and as a result red phosphor material is not needed for the optical system to produce white light. In this example, red light combines with blue and green light from blue and green phosphor material to form white light.

In yet another embodiment, violet LEDs and red LEDs are arranged according to a predetermined pattern. For example, violet LEDs are characterized by a wavelength emission ranging from 380 nm to 430 nm, and the red LEDs are characterized by a wavelength of about 590 nm to 650 nm. In this configuration, green and blue wavelength-emitting materials are used to convert radiation emitted by violet LEDs. For example, the red LEDs as shown are configured to provide red color light, and as a result red wavelength- emitting material is not needed for the optical system to produce white light. For example, red light combines with blue and green light from blue and green wavelength- emitting material to form white light.

FIG. 12A is a simplified diagram 1200 illustrating an optical device having red, green, and blue radiation sources disposed within recesses. In embodiments wherein portions of the final white light spectrum are contributed by direct emission from radiation sources, it is desirable to avoid interaction of such direct emission with any wavelength converting materials (e.g., down-conversion materials, phosphors). For example, for blue-emitting radiation sources whose spectra are being combined with other radiation sources that are pumping to longer wavelength down-conversion media (e.g., to make broader spectrum light), the down-conversion media can be isolated from the optical path of the blue-emitting LEDs. And, providing such an isolation (e.g., using an isolation barrier) increases efficiency as there are losses (e.g., backscattered light into LED chip) associated with down-conversion. Instead, it is preferable to provide optical means (e.g., an isolation barrier) to reflect light from the radiation sources towards the desired optical far-field such that this reflected light does not substantially interact with down-conversion media.

One such an embodiment is shown in FIG. 12A. As shown, LEDs are placed into recessed regions in a submount (e.g., substrate or package) such that they are optically isolated from one another. Further, light from direct-emitting LEDs does not interact with down-conversion media and instead, is substantially directed into the desired emission pattern of the entire LED package. Conversely, light from the down-converted LEDs (e.g., down-converting LED $1204_1$, down-converting LED $1204_2$) is converted locally and directed to the final emission pattern. In addition to providing efficient light collection from the direct-emitting LEDs, this design avoids cascading down-conversion events (e.g., violet down-converted to green, and green down-converted to red) which can unnecessarily reduce overall efficiency since quantum yields of down-conversion media are less than 100%.

Light from the individual LEDs are combined together in the far field to provide a uniform broadband emission which is a combination of light from the direct-emitting and down-converting LED chips.

FIG. 12B is a simplified diagram illustrating an optical device having red, green, and blue LEDs disposed between barriers. In the embodiment of FIG. 12B, the same benefits pertaining to disposition of radiation sources in proximity to isolation barriers are provided by fabrication of the isolation barriers using an additive, rather than subtractive process. In an additive processes, the barrier is formed by techniques such as overmolding, deposition/lithography/removal, attachment of a barrier mesh, etc. In subtractive processes, the recesses are formed by techniques such as deposition/lithography/removal and other techniques well known in the art.

The radiation sources can be implemented using various types of devices, such as light emitting diode devices or laser diode devices. In certain embodiments, the LED devices are fabricated from gallium and nitrogen submounts, such as GaN submount. As used herein, the term GaN submount is associated with Group III-nitride based materials including GaN, InGaN, AlGaN, or other Group III containing alloys or compositions that are used as starting materials. Such starting materials include polar GaN submounts (e.g., submount 111 where the largest area surface is nominally an (h k l) plane wherein h=k=0, and l is non-zero), non-polar GaN submounts (e.g., submount material where the largest area surface is oriented at an angle ranging from about 80-100 degrees from the polar orientation described above towards an (h k l) plane wherein l=0, and at least one of h and k is non-zero), or semi-polar GaN submounts (e.g., submount material where the largest area surface is oriented at an angle ranging from about +0.1 to 80 degrees or 110-179.9 degrees from the polar orientation described above towards an (h k l) plane wherein l=0, and at least one of h and k is non-zero).

The wavelength converting layers mentioned above are wavelength conversion materials, which can be ceramic or semiconductor particle phosphors, ceramic or semiconductor plate phosphors, organic or inorganic downconverters, upconverters (anti-stokes), nanoparticles, and other materials which provide wavelength conversion. Some examples are listed below:

(Sr,Ca)10(PO4)6*B2O3:Eu2+ (wherein 0<n^1)
(Ba,Sr,Ca)5(PO4)3(Cl,F,Br,OH):Eu2+,Mn2+
(Ba,Sr,Ca)BPO5: Eu2+,Mn2+
Sr2Si3O8*2SrCl2:Eu2+
(Ca,Sr,Ba)3MgSi2O8:Eu2+, Mn2+
BaAl8O13:Eu2+
2SrO*0.84P2O5*0.16B2O3:Eu2+
(Ba,Sr,Ca)MgAl10O17:Eu2+,Mn2+
K2SiF6:Mn4+
(Ba,Sr,Ca)Al2O4:Eu2+
(Y,Gd,Lu,Sc,La)BO3:Ce3+,Tb3+
(Ba,Sr,Ca)2(Mg,Zn)Si2O7:Eu2+
(Mg,Ca,Sr,Ba,Zn)2Si1_xO4__2x:Eu2+(wherein 0<x=0.2)
(Sr,Ca,Ba)(Al,Ga,m)2S4:Eu2+
(Lu,Sc,Y,Tb)2_u_vCevCa1+uLiwMg2_wPw(Si,Ge) 3_w012_u/2 where −O.SSu^l;
0<v£Q.1; and OSw^0.2
(Ca,Sr)8(Mg,Zn)(SiO4)4Cl2:Eu2+,Mn2+
Na2Gd2B2O7:Ce3+,Tb3+
(Sr,Ca,Ba,Mg,Zn)2P2O7:Eu2+,Mn2+
(Gd,Y,Lu,La)2O3:Eu3+,Bi3+
(Gd,Y,Lu,La)2O2S:Eu3+,Bi3+
(Gd,Y,Lu,La)VO4:Eu3+,Bi3+
(Ca,Sr)S:Eu2+,Ce3+
(Y,Gd,Tb,La,Sm,Pr,Lu)3(Sc,Al,Ga)5_nO12__3/2n:Ce3+ (wherein 0^0^0.5)
ZnS:Cu+,Cl~
ZnS:Cu+,Al3+
ZnS:Ag+,Al3+
SrY2S4:Eu2+
CaLa2S4:Ce3+
(Ba,Sr,Ca)MgP2O7:Eu2+,Mn2+
(Y,Lu)2WO6:Eu3+,Mo6+
CaWO4
(Y,Gd,La)2O2S:Eu3+
(Y,Gd,La)2O3:Eu3+

(Ca,Mg)xSyO:Ce
(Ba,Sr,Ca)nSinNn:Eu2+ (wherein 2n+4=3n)
Ca3(SiO4)Cl2:Eu2+
ZnS:Ag+,Cl~
(Y,Lu,Gd)2_nCanSi4N6+nCl_n:Ce3+, (wherein OSn^O.5)
(Lu,Ca,Li,Mg,Y)alpha-SiA;ON doped with Eu2+ and/or Ce3+
(Ca,Sr,Ba)SiO2N2:Eu2+,Ce3+
(Sr,Ca)AlSiN3:Eu2+
CaAlSi(ON)3:Eu2+
Sr10(PO4)6C12:Eu2+
(BaSi)O12N2:Eu2+
SrSi2(O,Cl)2N2:Eu2+
(Ba,Sr)Si2(O,Cl)2N2:Eu2+
LiM2O8:Eu3+ where M=(W or Mo)

For purposes of the application, it is understood that when a phosphor has two or more dopant ions (e.g., those ions following the colon in the above phosphors), this is to mean that the phosphor has at least one (but not necessarily all) of those dopant ions within the material. That is, as understood by those skilled in the art, this type of notation means that the phosphor can include any or all of those specified ions as dopants in the formulation. It is to be understood that nanoparticles, quantum dots, semiconductor particles, and other types of materials can be used as wavelength converting layers for color conversion as well.

Figure 13:
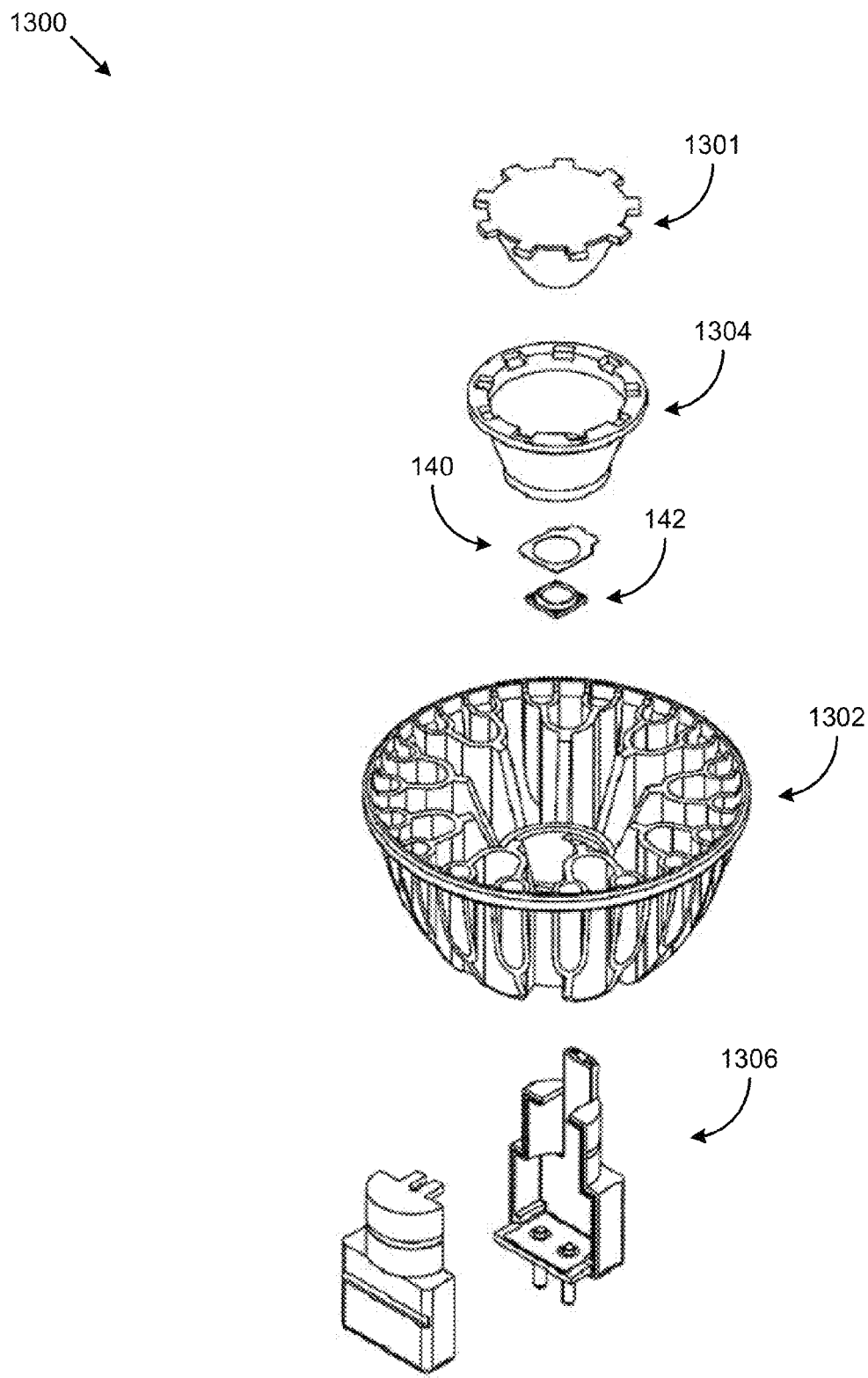
FIG. 13 is an exploded view of an LED lamp, according to some embodiments.

FIG. 13 is an exploded view of an LED lamp, according to some embodiments. The exploded view illustrates an LED lamp 1300 with an MR-16 type design. As shown, a finned heat sink 1302 is provided and one or more optical devices 150 (e.g., light source 142) can be positioned on the surface. Also shown in the exploded view is a cover member 140, the cover member having a mixture of wavelength converting materials distributed within the volume of the cover member. An LED lamp 1300 can comprise an insertable reflector 1304, and a protective lens 1301.

For embodiments powered by an external power source (e.g., a power source from outside the lamp), a housing 1306 is provided. As shown, the housing 1306 is configured to provide an electrical connection to an external power source. Further, such a housing comprises an interior void, suitable for containing electrical components (e.g., a driver), possibly disposed on a printed circuit board.

Figure 14:
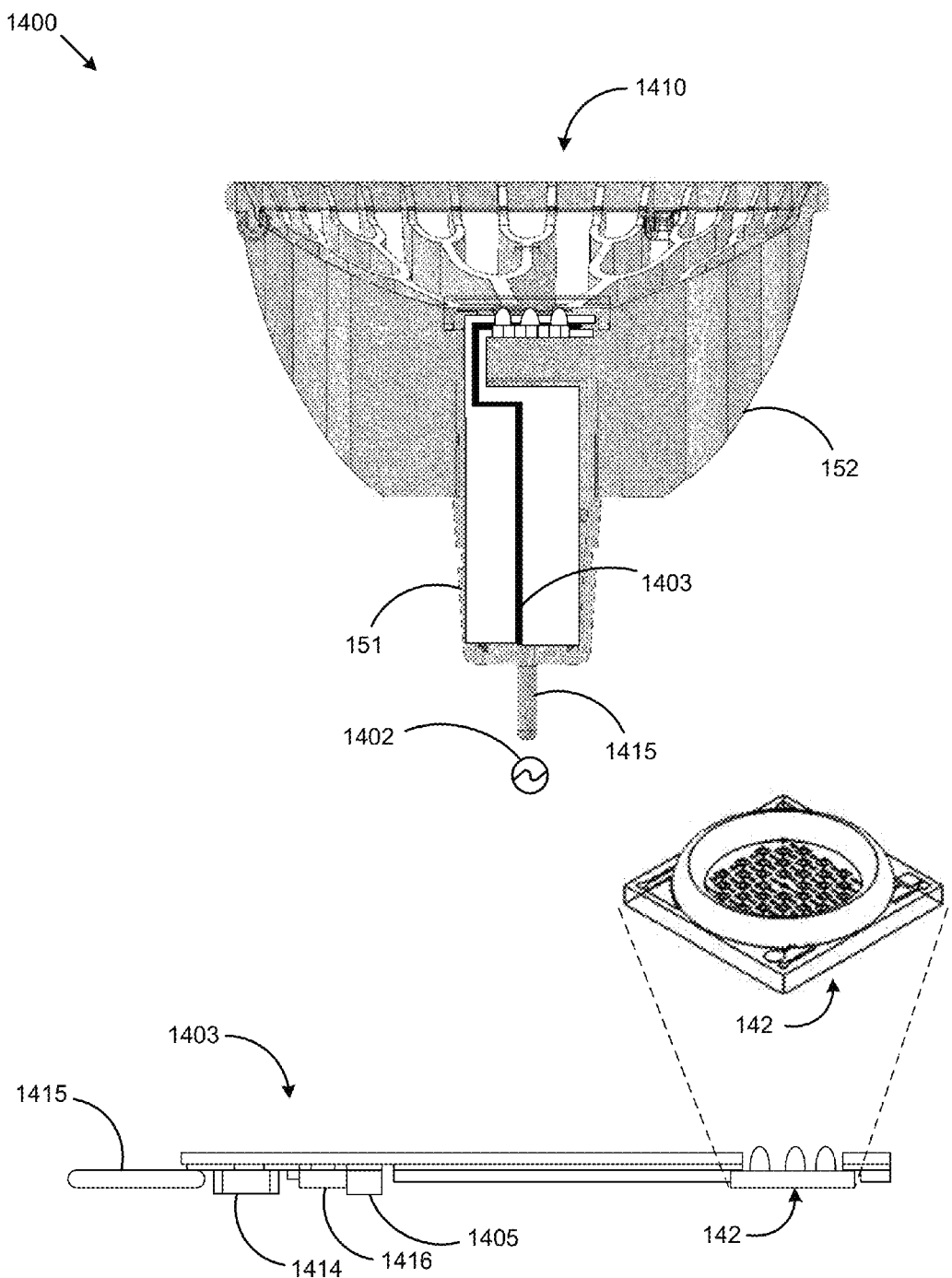
FIG. 14 is an illustration of an LED system comprising an LED lamp, according to an embodiment of the present disclosure.

FIG. 14 is an illustration of an LED system 1400 comprising an LED lamp 1410, according to some embodiments. The LED system 1400 is powered by an AC power source 1402, to provide power to a rectifier module 1416 (e.g., a bridge rectifier) which in turn is configured to provide a rectified output to an array of radiation emitting devices (e.g., a first array of radiation emitting devices, a second array of radiation emitting devices) comprising a light source 142. A current monitor module 1405 is electrically coupled to the first array and second array of radiation emitting devices such that the current monitor module can determine a first current level associated with the first array of radiation emitting devices and a second current level associated with the second array of radiation emitting devices; and a signal compensating module 1414 electrically coupled to the current monitor module 1405, the signal compensating module being configured to generate a first compensation factor signal based on a difference between the first current level and a first reference current level. As shown, the rectifier module 1416 and the signal compensating module (and other components) are mounted to a printed circuit board 1403. Further, and as shown, the printed circuit board 1403 is electrically connected to a power pin 1415 mounted within a base member 151, and the base is mechanically coupled to a heat sink 152. The heat sink and base provide mechanical stability for an insertable reflector 1304.

Figure 15:
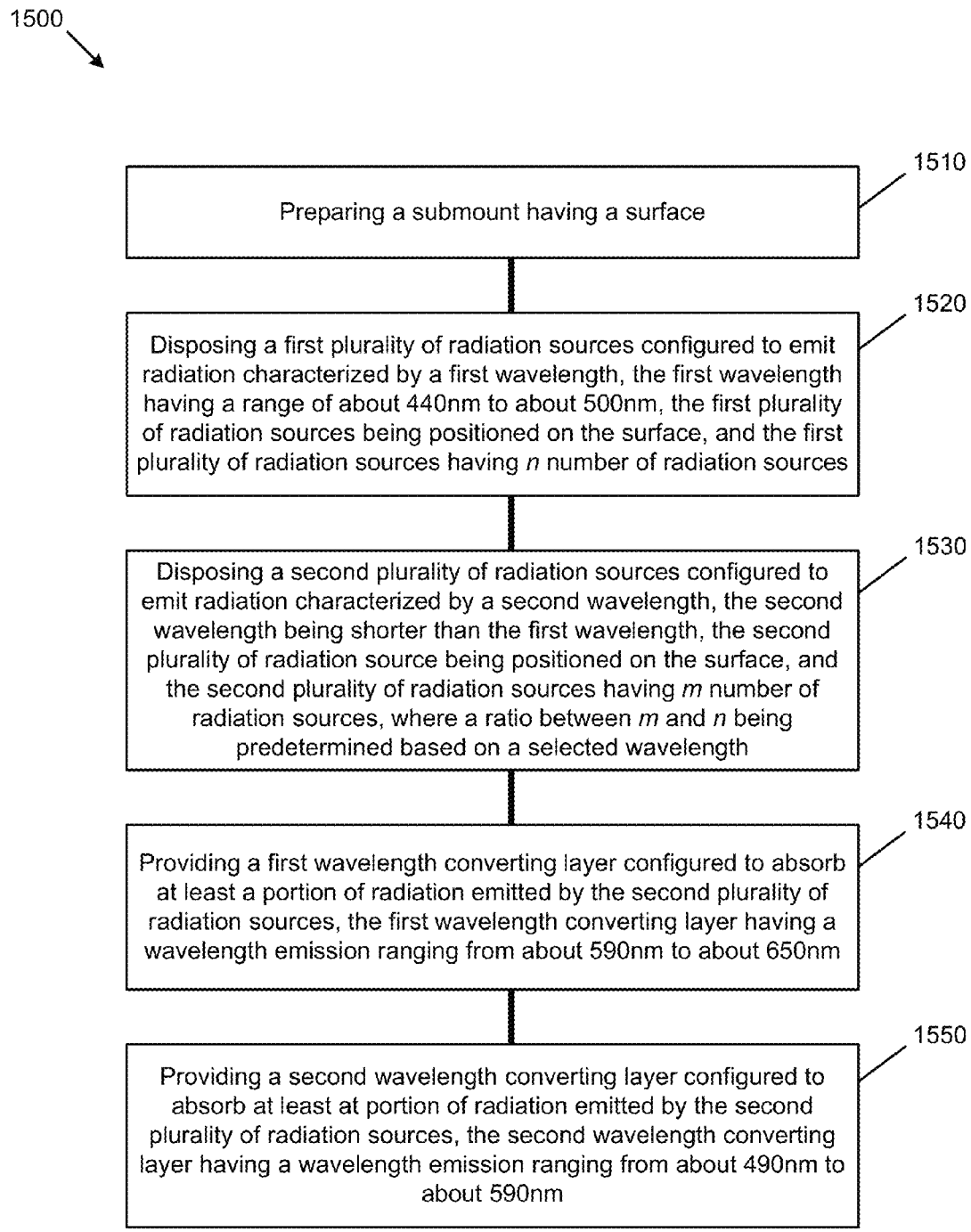
FIG. 15 is a block diagram of a system to perform certain operations to fabricate an optical device, according to an embodiment of the present disclosure.

FIG. 15 depicts a block diagram of a system to perform certain functions to fabricate an optical device. As an option, the present system 1500 may be implemented in the context of the architecture and functionality of the embodiments described herein. Of course, however, the system 1500 or any operation therein may be carried out in any desired environment. The operations of the system can, individually or in combination, perform method steps within system 1500. Any method steps performed within system 1500 may be performed in any order unless as may be specified in the claims. As shown, FIG. 15 implements fabrication of an optical device, comprising one or more steps for: preparing a submount having a surface (see module 1510); disposing a first plurality of radiation sources configured to emit radiation characterized by a first wavelength, the first wavelength having a range of about 440 nm to about 500 nm, the first plurality of radiation sources being positioned on the surface, the first plurality of radiation sources having n number of radiation sources (see module 1520); disposing a second plurality of radiation sources configured to emit radiation characterized by a second wavelength, the second wavelength being shorter than the first wavelength, the second plurality of radiation source being positioned on the surface, the second plurality of radiation sources having m number of radiation sources, where a ratio between m and n being predetermined based on a selected wavelength (see module 1530); providing a first wavelength converting layer configured to absorb at least a portion of radiation emitted by the second plurality of radiation sources, the first wavelength converting layer having a wavelength emission ranging from about 590 nm to about 650 nm (see module 1540); providing a second wavelength converting layer configured to absorb at least a portion of radiation emitted by the second plurality of radiation sources, the second wavelength converting layer having a wavelength emission ranging from about 490 mn to about 590 nm (see module 1550).

In one or more preferred embodiments, various pattern and/or arrangement for different radiation sources can be used. The above description and illustrations should not be taken as limiting the scope of the present disclosure which is defined by the appended claims.

What is claimed is:

1. An optical device comprising:
a mounting surface;
at least one first light emitting diode source, the at least one first light emitting diode source emitting radiation characterized by a first wavelength within a range from about 430 nm to about 480 nm, wherein the at least one first light emitting diode source is configured on the mounting surface;
at least one second light emitting diode source emitting radiation characterized by a second wavelength, the second wavelength being shorter than the first wavelength, wherein the at least one second light emitting diode source is configured on the mounting surface; and
a first wavelength-converting material positioned in an optical path of radiation from the at least one first light emitting diode source and configured to convert radiation from the first wavelength to radiation at a wavelength within a range from about 500 nm to about 600 nm;
wherein the optical device outputs a resulting radiation from at least the first light emitting diode source, the at least one second light emitting diode source, and the first wavelength-converting material.

2. An optical device comprising:
a mounting surface;
a plurality of first light emitting diode sources, each of the plurality of first light emitting diode sources emitting radiation characterized by a first wavelength within a range from about 430 nm to about 480 nm, wherein the plurality of first light emitting diode sources is configured on the mounting surface;
at least one second light emitting diode source emitting radiation characterized by a second wavelength, the second wavelength being shorter than the first wavelength, wherein the at least one second light emitting diode source is configured on the mounting surface;
a first wavelength-converting material positioned in an optical path of radiation from at least one of the plurality of first light emitting diode sources and configured to convert radiation from the first wavelength to radiation at a wavelength within a range from about 500 nm to about 600 nm; and
a second wavelength-converting material positioned in an optical path of radiation from at least one of the plurality of first light emitting diode sources and configured to convert radiation from the first wavelength to radiation at a wavelength within a range from about 590 nm to about 650 nm;
wherein the optical device outputs a resulting radiation from at least the plurality of first light emitting diode sources, the at least one second light emitting diode source, the first wavelength-converting material, and the second wavelength-converting material.

3. An optical device comprising:
a mounting surface;
a plurality of first light emitting diode sources, each of the plurality of first light emitting diode sources emitting radiation characterized by a first wavelength within a range from about 430 nm to about 480 nm, wherein the plurality of first light emitting diode sources is configured on the mounting surface;
at least one second light emitting diode source emitting radiation characterized by a second wavelength, the second wavelength being shorter than the first wavelength, wherein the at least one second light emitting diode source is configured on the mounting surface; and
a first wavelength-converting material positioned in an optical path of radiation from at least one of the plurality of first light emitting diode sources and configured to convert radiation from the first wavelength to radiation at a wavelength within a range from about 500 nm to about 600 nm;
wherein the plurality of first light emitting diode sources and the at least one second light emitting diode source are configured spatially on the mounting surface and are characterized by a predetermined ratio represented by a first number of first light emitting diode sources to a second number of second light emitting diode sources;
and wherein the optical device outputs a resulting radiation from at least the first plurality of light emitting diode sources, the at least one second light emitting diode source, and the first wavelength-converting material.

4. The optical device of claim 3, wherein the second wavelength is within a range from about 380 nm to about 430 nm.

5. The optical device of claim 3, wherein the first wavelength-converting material is positioned in the optical path of radiation from at least one of the at least one second light emitting diode sources and is configured to convert radiation from the first wavelength and from the second wavelength.

6. The optical device of claim 3, comprising a second wavelength-converting material positioned in an optical path of radiation from at least one of the plurality of first light emitting diode sources and configured to convert radiation from the first wavelength to radiation at a wavelength within a range from about 590 nm to about 650 nm.

7. The optical device of claim 3, comprising a second wavelength-converting material positioned in an optical path of radiation from the at least one of the at least one second light emitting diode source and configured to convert radiation from the second wavelength to radiation at a wavelength within a range from about 590 nm to about 650 nm.

8. The optical device of claim 3, comprising a second wavelength-converting material positioned in an optical path of radiation from at least one of the plurality of first light emitting diode sources and from at least one of the at least one second light emitting diode source, and configured to convert radiation from the first wavelength and from the second wavelength to radiation at a wavelength within a range from about 590 nm to about 650 nm.

9. The optical device of claim 8, where the first wavelength-converting material and the second wavelength-converting material are mixed with encapsulating material.

10. The optical device of claim 3, comprising at least one third light emitting diode source emitting radiation characterized by a third wavelength, the third wavelength being longer than the first wavelength, wherein the at least one third light emitting diode source is configured on the mounting surface.

11. The optical device of claim 10, wherein the third wavelength is within a range from about 590 nm to about 650 nm.

12. The optical device of claim 3, wherein,
the plurality of first light emitting diode sources comprises n first light emitting diodes;
the at least one second light emitting diode source comprises m second light emitting diodes; and
a ratio of the number n to the number m (n:m) is greater than 1.

13. The optical device of claim 3, wherein the optical device is configured to emit substantially white light.

14. The optical device of claim 3, wherein the plurality of first light emitting diode sources and the at least one second light emitting diode source comprise a gallium- and nitrogen-containing material.

15. The optical device of claim 3, wherein the plurality of first light emitting diode sources and the at least one second light emitting diode source are configured in an array pattern.

16. The optical device of claim 3, wherein the mounting surface comprises a single mounting surface.

17. The optical device of claim 3, further comprising an optical system.

18. The optical device of claim 3, where the first wavelength-converting material is remote from the plurality of first light emitting diode sources.

19. The optical device of claim 3, wherein the resulting radiation is emanated through a light emitting surface, the light emitting surface having a predetermined shape selected from a square, a rectangle, a hexagon, a regular polygon, and a circle.

20. The optical device of claim 3, where the plurality of first light emitting diode sources and the at least one second light emitting diode source are connected to a common electrical circuit enabling electrical injection.

* * * * *

UNITED STATES PATENT AND TRADEMARK OFFICE
CERTIFICATE OF CORRECTION

PATENT NO. : 8,905,588 B2  
APPLICATION NO. : 14/256670  
DATED : December 9, 2014  
INVENTOR(S) : Michael Krames et al.

Page 1 of 1

It is certified that error appears in the above-identified patent and that said Letters Patent is hereby corrected as shown below:

On the title page, in the left-hand column, in Item (73) titled ASSIGNEE, please delete "Sorra, Inc., Fremont, CA (US)"

and insert -- "Soraa, Inc., Fremont, CA (US)" --

Signed and Sealed this
Seventh Day of July, 2015

Michelle K. Lee
*Director of the United States Patent and Trademark Office*